(12) United States Patent
Abe et al.

(10) Patent No.: US 7,793,848 B2
(45) Date of Patent: Sep. 14, 2010

(54) SEMICONDUCTOR DEVICE AND MANUFACTURING METHOD THEREOF

(75) Inventors: Hiroko Abe, Setagaya (JP); Mikio Yukawa, Atsugi (JP); Ryoji Nomura, Yamato (JP); Satoshi Seo, Kawasaki (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 994 days.

(21) Appl. No.: 11/587,531

(22) PCT Filed: Nov. 28, 2005

(86) PCT No.: PCT/JP2005/022241

§ 371 (c)(1),
(2), (4) Date: Oct. 25, 2006

(87) PCT Pub. No.: WO2006/059746

PCT Pub. Date: Jun. 8, 2006

(65) Prior Publication Data

US 2008/0093462 A1 Apr. 24, 2008

(30) Foreign Application Priority Data

Nov. 30, 2004 (JP) ............................ 2004-347754

(51) Int. Cl.
*G06K 19/06* (2006.01)
(52) U.S. Cl. .................. 235/492; 235/451; 235/441; 235/375
(58) Field of Classification Search .............. 235/492, 235/451, 441, 375; 365/163, 145, 148
See application file for complete search history.

(56) References Cited

U.S. PATENT DOCUMENTS 5,786,827 A 7/1998 Jukl et al.

(Continued)

FOREIGN PATENT DOCUMENTS

EP 1 324 326 7/2003

(Continued)

OTHER PUBLICATIONS

International Search Report (Application No. PCT/JP2005/022241) dated Mar. 7, 2006.

(Continued)

*Primary Examiner*—Edwyn Labaze
(74) *Attorney, Agent, or Firm*—Eric J. Robinson; Robinson Intellectual Property Law Office, P.C.

(57) ABSTRACT

It is an object of the present invention to provide a semiconductor device having a memory circuit which is nonvolatile and able to be written additionally, an antenna which can be easily manufactured, and to provide a manufacturing method thereof. In addition, it is an object of the present invention to prevent unauthorized rewriting of information of a wireless chip and forgery of a wireless chip itself and to ensure a security of a wireless chip. In view of the foregoing, the present invention provides an IC tag in which information thereof is identified by wireless communication signal and also information of a memory in an IC tag (a memory which can not be rewritten) is identified by an optical reading device. A memory in an IC tag according to the present invention has an identification surface with which information can be identified by an optical reading device.

13 Claims, 14 Drawing Sheets

U.S. PATENT DOCUMENTS

| | | | |
|---|---|---|---|
| 5,932,866 A | 8/1999 | Terada et al. | |
| 6,858,278 B2 | 2/2005 | Kojima et al. | |
| 6,862,046 B2 | 3/2005 | Ko | |
| 7,205,562 B2 * | 4/2007 | Wicker | 257/2 |
| 2002/0191108 A1 | 12/2002 | Ko | |
| 2003/0179117 A1 | 9/2003 | Kojima et al. | |
| 2004/0023069 A1 | 2/2004 | Kojima et al. | |
| 2004/0037106 A1 | 2/2004 | Lu et al. | |
| 2004/0046036 A1 | 3/2004 | Koshimizu et al. | |
| 2004/0065906 A1 * | 4/2004 | Asao | 257/208 |

FOREIGN PATENT DOCUMENTS

| | | |
|---|---|---|
| EP | 1 437 722 | 7/2004 |
| JP | 2002-123805 | 4/2002 |
| JP | 2003-005733 | 1/2003 |
| JP | 2003-229538 | 8/2003 |

OTHER PUBLICATIONS

Written Opinion (Application No. PCT/JP2005/022241) dated Mar. 7, 2006.

"Office Action(Application No. 05811206.1) Dated Apr. 1, 2010," Eng.

* cited by examiner

SEMICONDUCTOR DEVICE AND MANUFACTURING METHOD THEREOF

TECHNICAL FIELD

The present invention relates to an integrated circuit having an antenna and a memory for identifying and management of goods, merchandise, and people. More specifically, the present invention relates to a wireless IC tag such as a wireless IC tag and related goods.

BACKGROUND ART

A barcode can be nominated as an object for identifying goods. The barcode is printed on goods directly by flexography (a printing method using a relief plate made of rubber or flexible synthetic resin), offset printing, gravure printing, and the like; or printed on a label first, before being attached to goods. By using a barcode, data of a barcode (price or name of merchandise) can be read by an optical reading device also called a barcode reader. According to the data, management of the sales volume, stocks, and distribution can be conducted. However, there are problems of a barcode in terms of information and function, for example, a number of digits is small and security is not ensured.

In recent years, there has been an attempt to conduct management of goods, streamlining of distribution, and management of information of merchandise by mounting a semiconductor device which can send and receive data wirelessly, typically an item called a wireless chip (also called an ID tag, an IC tag, an IC chip, an RF (Radio Frequency) tag, a wireless tag, an electric tag, or an RFID (Radio Frequency Identification)) on goods instead of using a barcode. However, a wireless chip has an inconvenient aspect that communication with a reader/writer having an antenna is required to know the information in a wireless chip, and the information can not be known without a reader/writer. Also there arise problems of security such as a fear that unauthorized rewriting of the information of a wireless chip may be conducted or a fear of forgery of a wireless chip itself. In addition, there is a problem that the information itself may be lost or may not be read if an IC tag is broken for any reason.

DISCLOSURE OF INVENTION

In resent years, development has been advanced on a semiconductor device which can send and receive data wirelessly by providing an integrated circuit and an antenna over a semiconductor substrate. A conventional wireless chip does not have a memory. Therefore, it can only judge whether there is a wireless chip or not.

A semiconductor device with a high function and a high added value can be provided by providing a memory circuit (also referred to as a memory, simply) as a circuit integrated over a semiconductor substrate.

It is an object of the present invention to provide a semiconductor device having a memory circuit which is nonvolatile and able to be written additionally, an antenna which can be easily manufactured, and to provide a manufacturing method thereof. In addition, it is an object of the present invention to prevent unauthorized rewriting of information of a wireless chip and forgery of a wireless chip itself and to ensure a security of a wireless chip.

When a wireless chip is used in a shop or the like, an information tag or a label which is identified by human eyes is also attached to merchandise with a wireless chip. However, since a wireless chip and a sign or a label are attached separately, each information thereof easily becomes different from each other when a wireless chip is broken or either a wireless chip and an information tag or a label comes unstuck, or is replaced by another.

In view of the foregoing, the present invention provides an IC tag in which information thereof is identified by wireless communication signal and information of a memory in an IC tag (a memory which can not be rewritten) is also identified by an optical reading device. A memory in an IC tag according to the present invention has an identification surface with which information can be identified by an optical reading device.

In a conventional memory using a semiconductor device, information is read using an electrical signal, and an optical reading device is not used. The known memory circuits are, for example, a DRAM, an SRAM, a FeRAM, a mask ROM, an EPROM, an EEPROM, a flash memory, and the like. Among these, since a DRAM and an SRAM are volatile memory circuits in which data are erased by turning off the power, data need to be written every time the power is turned on. Meanwhile, a FeRAM is a nonvolatile memory circuit. Since a FeRAM uses a capacitor element including a ferroelectric layer, a number of manufacturing steps thereof is increased. Although a mask ROM has a simple structure, data need to be written in a manufacturing step and data cannot be written additionally. An EPROM, an EEPROM, and a flash memory are nonvolatile memory circuits; however, there is a problem that numbers of manufacturing steps of them are increased because an element including two gate electrodes is used.

In the present invention, a semiconductor substrate is not used. Instead, a TFT is used to form various circuits such as a memory. In the case of a TFT, a manufacturing cost can be significantly lowered compared with the case of a semiconductor substrate. In addition, an adhesion is better compared with the case of a semiconductor substrate since a TFT can be formed over a base material of an IC tag. In the case of a semiconductor substrate, it is difficult for a base material, an antenna, and an IC chip to be connected to and adhered to each other. There is a defect that in an IC tag with a semiconductor substrate, a connecting portion and an adhesive portion are easily broken when the IC tag is bent by external force. When a TFT is used, an IC tag with high resistance to bending by external force can be provided. In addition, the total thickness of an IC tag can be reduced compared with that of a semiconductor substrate.

An IC tag according to the present invention has an antenna, a memory whose information can be read by an optical reading device, and a conductive circuit which connects the antenna and the memory with each other. The antenna generates an induction electromotive force to supply an operating power for writing information data in the memory and reading out the stored information data from the memory.

According to the present invention, information can be collated by using different kinds of identifying means such as both of a wireless communication signal reading means and an optical reading means and checked whether the information is accorded to each other or not, thereby an error in reading is reduced. If an optical reading device is not used, an IC tag to which information is written and an IC tag to which information is not written can be easily distinguished when it is viewable whether information is written to a memory or not.

An identification surface of a memory may display a letter, a number, and a barcode or the like. It is to be noted that an identification surface of a memory is not a display. When information is written to a memory, an optical property of a part of an identification surface is changed to display a pattern by reflecting irradiated light. Accordingly, when an imaging means such as a CCD is used as an optical reading device, a patterning image can be taken by a CCD to identify and read information of the memory by analyzing the image.

An IC tag is in contact with or placed with a predetermined gap between a head part of a means for writing and reading data (a reader/writer) connected to an information terminal device (such as a personal computer). According to a radio wave with a predetermined frequency based on information from an antenna of the reader/writer, an antenna of the IC tag generates an induction electromotive force for generating a writing signal and a reading signal with a circuit connected to the antenna. Then, a data is written to the memory by a writing signal caused by an induction electromotive force, and the data stored in the memory is read using a reading signal caused by an induction electromotive force.

Although a reader/writer may both write and read, in the present invention, to prevent falsification and an unauthorized use, a material layer between a bit line and a word line in a memory is formed from an organic or an inorganic material whose phase changes irreversibly, accordingly, writing to a memory is conducted once. An organic or an inorganic material used for a material layer in a memory (memory element) according to the present invention changes its phase to change an electrical resistivity and an optical property thereof. A material between two electrodes in a memory (memory element) changes an optical property from an amorphous state which is not transparent to a crystalline state which is transparent before and after information is written.

An inorganic material which can be used for a material layer between two electrodes in a memory and which changes the phase irreversibly is an inorganic material which changes only from an amorphous state to a crystalline state such as a material containing a plurality of materials selected from tellurium (Tel), tellurium oxide (TeOx), antimony (Sb), selenium (Se), and bismuth (Bi).

Alternatively, as a material layer between the two electrodes of a memory (a memory element), a mixed layer of an organic material and an inorganic material can be used. For example, a material layer containing a metal oxide (such as molybdenum oxide, vanadium oxide, ruthenium oxide, cobalt oxide, and copper oxide) and an organic compound may be used as the material layer or as one of stacked layers between two electrodes.

It is to be noted that information can be written to an IC tag either before or after the IC tag is attached to goods.

In the case information data is written to a memory optically, the information data of the memory is read by irradiating the memory having an identification surface with light with a different wave length from that of the light for writing data and detecting the reflected light with a sensor.

When only a wireless communication signal is used, information can be read collectively to be stored in an information terminal device. To prevent falsification and an unauthorized use, information may be collated at least two times in distribution, specifically, immediately after information is written to an IC tag, and when information is read from an IC tag finally.

A structure of the present invention disclosed in this specification is a structure comprising a memory having a memory cell array which has a plurality of memory cells, a circuit for controlling the memory, and an antenna, wherein the memory cell array has a bit line extended to a first direction, a word line extended to a second direction which is perpendicular to the first direction, and a material layer whose phase change takes places irreversibly between the bit line and the word line, either or both of the bit line and the word line have a light transmitting property, and wherein the memory has an identification surface with which recorded information is read by an optical reading means.

In addition to the foregoing structure, the structure has a collating means for collating a first data which is obtained by reading a recorded data in the memory using a wireless signal and a second data which is obtained by reading a data from the identification surface of the memory using the optical reading means. By using the collating means, an error in reading can be reduced.

The reading means is not limited to an optical reading means and a wireless signal reading means. In addition to the foregoing, there is another structure which comprises a memory having a memory cell array which has a plurality of memory cells, a circuit for controlling the memory, and an antenna, wherein the memory cell array has a bit line extended to a first direction, a word line extended to a second direction which is perpendicular to the first direction, and a material layer whose phase change takes place irreversibly between the bit line and the word line, either or both of the bit line and the word line have a light transmitting property, and wherein the memory has one recoded data read by a plurality of different reading means.

In the each foregoing structure, a phase of the material layer changes from a first state to a second state by light irradiation and thereby, electrical resistance between the bit line and the word line changes. By applying the foregoing structure having this kind of characteristic, writing to the memory can be conducted only once to prevent falsification and an unauthorized use.

In the each foregoing structure, a phase of the material layer changes from the first state to the second state by light irradiation and a change can be read at the identification surface. By applying the foregoing structure having this kind of characteristic, whether information is written to a memory or not is easily judged.

In the each foregoing structure, the circuit for controlling the memory has a thin film transistor. By applying the foregoing structure having this kind of characteristic, a semiconductor having high resistance to bending can be manufactured. A thin film transistor which is formed using an organic material such as pentacene may be used.

In the each foregoing structure, the semiconductor device has a circuit which is connected to the antenna and the circuit has a thin film transistor. By applying the foregoing structure having this kind of characteristic, the circuit for controlling the memory and the circuit which is connected to the antenna can be manufactured by the same process.

In the each foregoing structure, the circuit for controlling the memory and the circuit which is connected to the antenna are formed over a common base material. By applying the foregoing structure having this kind of characteristic, a mass production with a large substrate can be performed to lower a unit price.

In the each foregoing structure, the semiconductor device is sealed by a base material and a sealing material and either or both of the base material and the sealing material have a light transmitting property. Alternatively, the semiconductor device may be sealed with a lamination film which has a light transmitting property.

In the each foregoing structure, the semiconductor device is interposed between a base material and a sealing material, and the base material and the sealing material contain resin.

According to the present invention, a semiconductor device having a memory circuit in which data is written thereto by both of an optical action and an electrical action, and data is read by both of an optical reading device and an electrical signal reading device can be realized.

In addition, according to the present invention, forgery of an IC tag can be prevented and security thereof can be improved. A memory circuit in the semiconductor device according to the present invention is written with data by an optical action and an electrical action, is nonvolatile, and is available for adding data. Thus, forgery by rewriting data can be prevented. In addition, new data can be written additionally. That is, the present invention can provide a semiconductor device having a memory element which can not be rewritten.

BRIEF DESCRIPTION OF THE DRAWINGS

FIGS. 5A to 5C are top views and cross-sectional views of a memory portion in a semiconductor device according to the present invention;

BEST MODE FOR CARRYING OUT THE INVENTION

Embodiment modes of the present invention are described below.

EMBODIMENT MODE 1

Figure 1A:
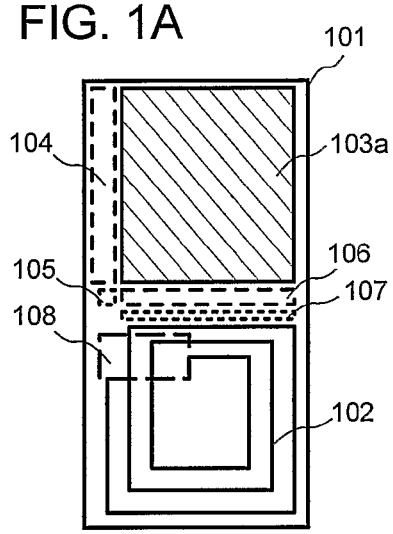
FIGS. 1A to 1F are top views and cross-sectional views of a semiconductor device according to the present invention.
Figure 1B:
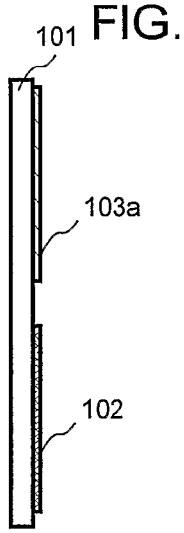

FIGS. 1A and 1B show an example of a semiconductor device according to the present invention which can send and receive data without contact. FIG. 1A shows a top view of the semiconductor device according to the present invention and FIG. 1B shows a schematic side view of FIG. 1A.

The semiconductor device according to the present invention shown in FIG. 1A has a structure in which a plurality of circuits (a memory portion and a data sending and receiving portion) is integrated on one base material 101. The memory portion and the data sending and receiving portion are placed to be next to each other so that superposition of noise and interaction between circuits can be reduced. The memory portion has at least a memory cell array 103a having an identification surface, decoder circuits 104 and 105, a selector circuit 106, and a reading and writing circuit 107. The data sending and receiving portion has at least an antenna 102 and an integrated circuit 108 being connected to the antenna. The antenna may be formed by a printing method or by a photolithography method in the same step of forming a wiring in the integrated circuit.

The decoder circuits 104 and 105, the selector circuit 106, the reading and writing circuit 107, and the integrated circuit 108 being connected to the antenna are formed of a TFT and can be manufactured by the same step over a common base material.

FIG. 1A shows the top view of the semiconductor device before data is written. In the memory sell array 103a having the identification surface, the whole identification surface has an even surface.

Figure 1C:
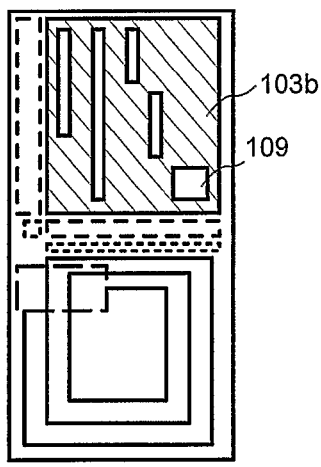

The operation of writing data is described with reference to FIGS. 1C and 1D. When writing data to the memory cell array by irradiating the semiconductor device with light as shown in FIG. 1A, a portion which is irradiated is changed and the memory cell array 103a becomes a memory cell array 103b having an identification surface provided with a certain designed pattern 109 as shown in FIG. 1C.

Figure 1D:
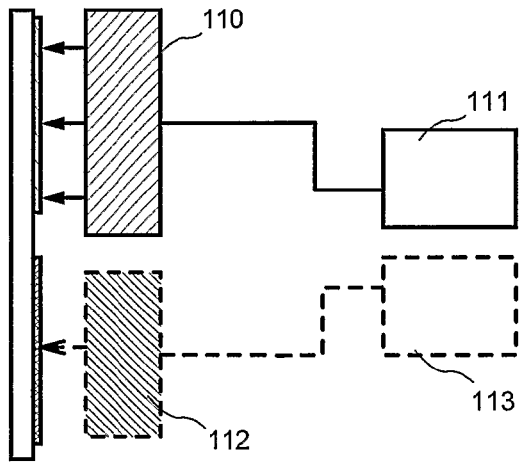

FIG. 1D shows a side view of the semiconductor device to which data is written by an optical action. As shown in FIG. 1D, the memory cell array is selectively irradiated with light by a writing means (writer) 110 for irradiating light to a memory and a controlling means 111 for controlling the writing means 110 to obtain an identification surface provided with the pattern 109.

A memory cell array has memory cells including memory elements arranged in matrix. A memory element has a first conductive layer for forming a bit line, a second conductive layer for forming a word line, and an organic compound layer formed therebetween. In the case where both of a TFT and a memory element are provided in one region and arranged in matrix, a memory cell refers to a memory element and a TFT. In the case where only a memory element is provided in one region and arranged in matrix, a memory cell refers to only a memory element.

When the organic compound layer is irradiated with light such as laser light through the second conductive layer having a light transmitting property, a phase change or a breakdown of the organic compound layer is caused by laser light irradiation, thereby change of the memory element in the optical property or the electrical resistance occurs. For example, assuming that a memory element which is not irradiated with laser light has data "0", an optical property or electrical resistance may be changed by laser light irradiation to the memory element to write data "1" to the memory element.

For example, by adjusting a material for an organic compound layer or intensity of laser light, the organic compound layer which is in an amorphous state and does not have a light transmitting property can be changed into a material which is in crystalline state and has a light transmitting property by laser light irradiation. Alternatively, data can be written by insulating the organic compound layer with laser light irradiation.

When a conjugated polymer doped with a compound which generates acid by absorbing light (photoacid generator) is used for the organic compound layer, conductivity increases at only the portion of being irradiated with laser light, whereas a portion of not being irradiated with laser light has no conductivity when the organic compound layer is irradiated with laser light. Therefore, data is written by utilizing the phenomenon that electric resistance of a memory element is changed by laser light irradiation to a selected organic compound layer. For example, in the case where a memory element which is not irradiated with laser light is assumed to have data "0", a selected memory element is irradiated with laser light to increase conductivity in the case of writing data "1".

Instead of the writing means 110 for writing data by light irradiation, a writing means 112 for writing data by an electrical signal may be employed. In that case, an antenna 102 sends and/or receives data with the writing means 112 for writing data by an electrical signal and a controlling means 113 for controlling the writing means 112 to obtain an identification surface having a certain designed pattern. When the pattern is visible for human eyes, whether data is written or not can be judged. Alternatively, a pattern can be encoded to be easily read optically like a bar code.

Alternatively, both of the writing means 110 for writing data by emitting light and the writing means 112 for writing data by an electrical signal can be used to write the same data to a memory to prevent an error in writing.

Although FIG. 1C shows an identification surface having a pattern, the pattern is not necessarily recognized by human eyes. The pattern may be one which can be read by an optical reading device using light having a certain wavelength.

Figure 1E:
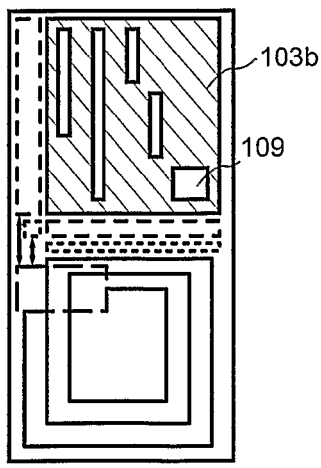
Figure 1F:
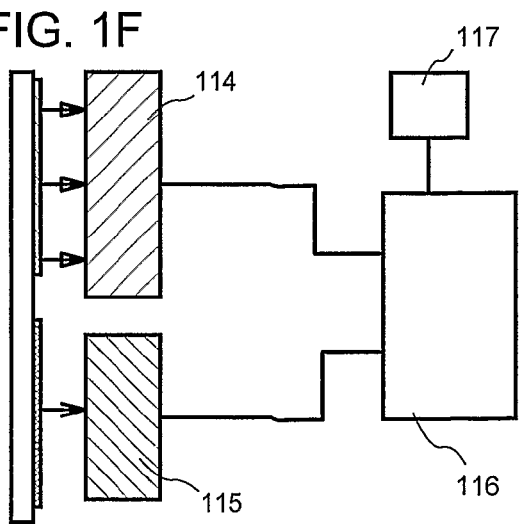

Next, the operation of reading data is described with reference to FIGS. 1E and 1F.

By applying voltage between the first conductive layer and the second conductive layer, data is read with both of an electrical signal reading device 115 for reading a resistance value of the memory element and an optical reading device 114 for reading a pattern by light irradiation. The two reading devices may read data at the same time or separately. As the optical reading device 114, an imaging unit such as an image scanner and a CCD camera can be used. As an electrical signal reading device 115, a reader/writer having an antenna can be used.

When data is written to a memory by an optical action or by an electrical action, the light transparency of the memory element results in a different value from that of the memory element without an optical action or an electrical action. The pattern produced by the difference in the optical property is read optically so that data can be read.

If the pattern of a memory is identified at visible light, whether data is written to the memory element can be seen by human eyes. In a conventional memory element, data can not be identified by an optical reading device or human eyes.

When data is written to a memory by an optical action or by an electrical action, the resistance value of the memory element results in a different value from that of the memory element without an optical action or an electrical action added thereto. The difference in the resistance value can be read optically, thereby data can be read.

The data read through the two different kinds of reading devices is collated by a collating means 116. The result is sent to an information terminal 117 and is identified. According to the present invention, an error in reading can be reduced. It is noted that the information terminal 117 and the collating means 116 may be connected to each other by a wiring code or they may exchange data via wireless communication.

A writing device (writer) and a reading device (reader) may be replaced by one device having a structure of a so-called reader/writer.

In the case where a part of the pattern is visible for human eyes, a display tag and a label are not needed to be attached.

In the present invention, since a memory and an antenna are provided on the common substrate, and so there is no fear that either of which comes unstuck or is replaced by another memory or antenna. Further, a memory and an antenna are connected to each other electrically; therefore they cannot be easily separated. In addition, a memory is formed from an organic compound material, which is easily altered on exposure to air such as oxygen, so even when a memory is taken apart for forgery, the organic compound material used for the memory can not be easily identified. Consequently, forgery can be prevented.

EMBODIMENT MODE 2

A semiconductor device according to the present invention has a structure in which a plurality of circuits is integrated and also in which a layer including a plurality of thin film transistors and a layer including a plurality of memory elements are stacked sequentially. In addition, a semiconductor device according to the present invention has a sealing film including a conductive layer which functions as an antenna. The sealing film which serves as an antenna overlaps the edge of the layer including a plurality of memory elements.

Figure 2A:
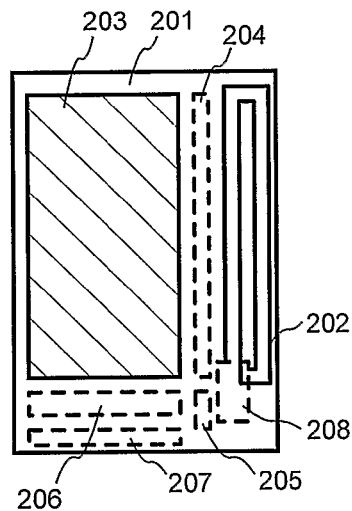
FIGS. 2A and 2B are a top view and a cross-sectional view of a semiconductor device according to the present invention.

FIG. 2A shows an example of a top view of a semiconductor device according to the present invention. The memory portion has at least a memory cell array 203 having an identification surface, decoder circuits 204 and 205, a selector circuit 206, and a reading and writing circuit 207. The data sending and receiving portion has at least an integrated circuit 208 being connected to an antenna. The circuits are provided on the common base material while the antenna 202 is provided on the sealing film and connected to the integrated circuit 208 through conductive particles.

An example of the cross sectional view of the semiconductor device according to the present invention is described with reference to FIG. 2B. FIG. 3 shows an equivalent circuit diagram corresponding to FIG. 2A or 2B.

On the base material, a memory portion in which TFTs are arranged in matrix is formed. An integrated circuit which is formed around the memory portion is also formed from a semiconductor element such as a TFT. FIG. 2B shows a CMOS circuit (a circuit in which an n-channel TFT 211a and a p-channel TFT 211b are complementarily combined) which is often used. A CMOS circuit includes a circuit which has at least one n-channel TFT and one p-channel TFT (such as an inverter circuit, a NAND circuit, an AND circuit, an NOR circuit, an OR circuit, a shift register circuit, a sampling circuit, a D/A converter circuit, an A/D converter circuit, a latch circuit, a buffer circuit). The CMOS circuit is connected to the other circuits through a wiring 212c.

Each of TFT 210a, 210b, 211a, and 211b has a first interlayer insulating film 214. A second insulating layer 215 is formed so as to cover each TFTs and a plurality of memory elements is formed on the second conductive layer. FIG. 2B shows both of the memory element to which data is not written and the memory element to which data is written.

A memory element 221 arranged in matrix in a memory portion has a first conductive layer 212a for forming a bit line Bx ($1 \leq x \leq m$), a second conductive layer 214a for forming a word line Wy ($1 \leq y \leq n$), and an organic compound layer 213a formed therebetween. A partition 216 is formed between neighboring organic compound layers 213a. The first conductive layer 212a and the second conductive layer 214a are formed to be stripe shaped so that the first conductive layer 212a and the second conductive layer 214a intersect with each other.

Figure 2B:
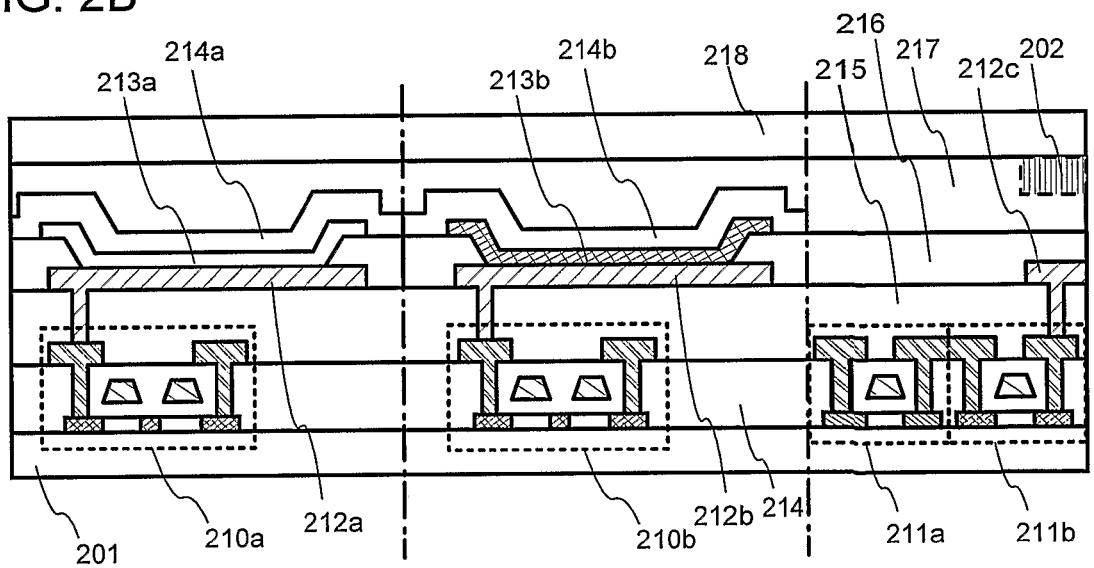
Figure 3:
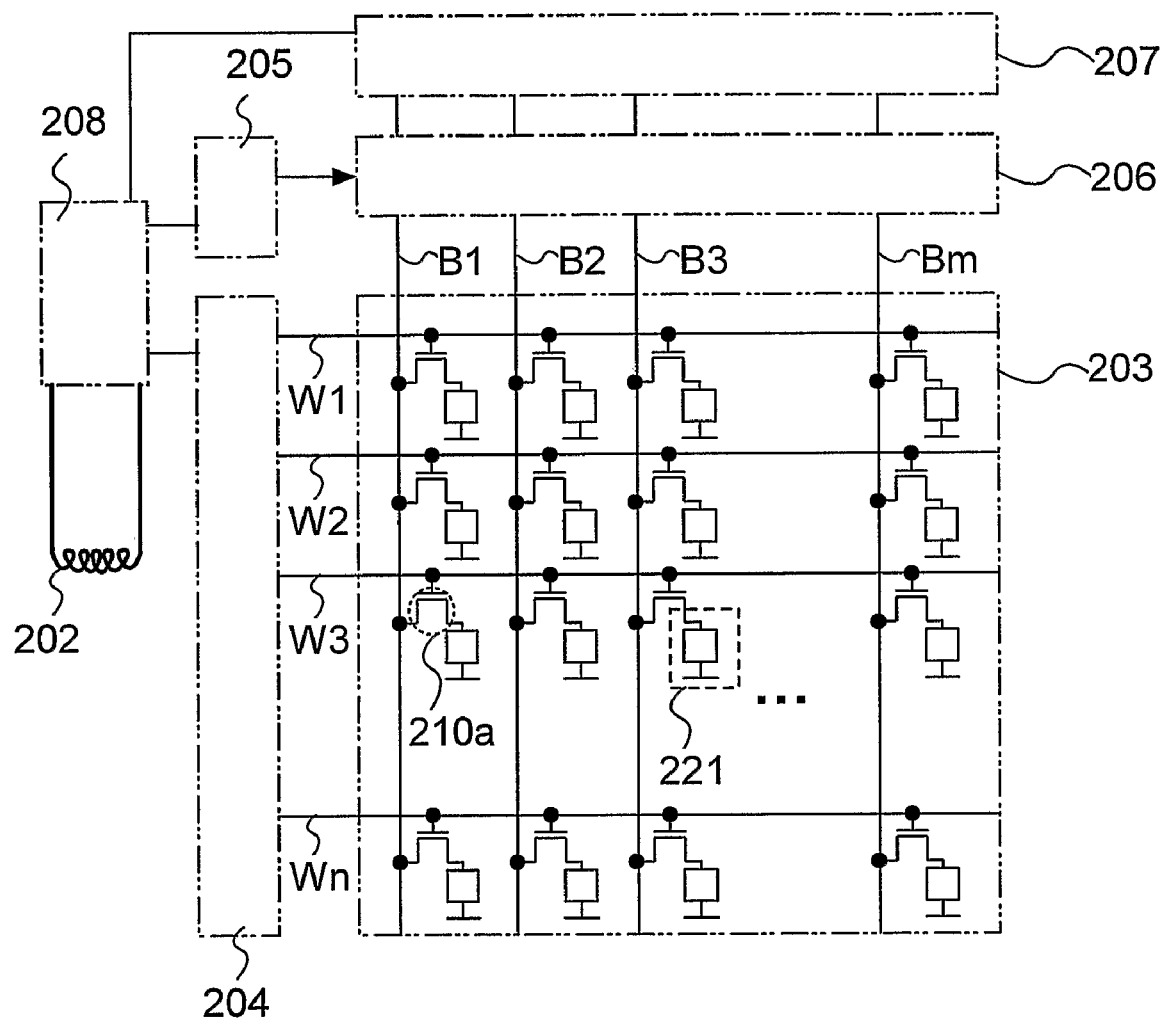
FIG. 3 is an equivalent circuit diagram of a semiconductor device according to the present invention.

FIG. 2B shows a memory element to which data is written by an optical action. In the case of writing data by an optical action, either or both of the first conductive layer 212a and the second conductive layer 214a need to have a light transmitting property. The conductive layer having a light transmitting property is formed from a light transmitting conductive material such as an indium tin oxide (ITO) or formed from a conductive material which does not have a light transmitting property to have a thickness through which light is transmitted.

When data is written by an optical action, an optical property of an organic compound layer 213b before writing data of the memory element after writing data is different from that of the organic compound layer 213a and the difference is shown in the identification surface of the memory cell array 203 as a pattern.

A state of an electrical short circuit between a first conductive layer 212b for forming a bid line and a second conductive layer 214b for forming a word line can be referred to as a state of the memory element to which data is written. In order to short circuit electrically a pair of electrodes, the p-channel TFT 210b preferably has a multi gate structure to prevent the p-channel TFT 210b from being short circuited in advance.

The memory element and the circuit may be covered with a protective film in order to improve the reliability.

The memory element and the circuit are sealed by a sealing plate 218 with an adhesive layer 217. The antenna 202 is previously printed on the sealing plate 218 and the antenna 202 is connected to the wiring formed on the base material 201 so that the antenna and the wiring are conducted. A part of the antenna 202 may overlap the integrated circuit 208 connecting to the antenna.

In the case where data is written or read by an optical action, at least the material on the side from which the data is written or read has a light transmitting property. For example, when data is written or read by an optical action from the sealing plate side, the sealing plate, adhesive layer 217, the second conductive layers 214a and 214b are formed from a light transmitting material. On the other hand, when data is written or read by an optical action from the base material side, the base material, the first interlayer insulating layer, the second interlayer insulating layer, and the first conductive layer are formed from a light transmitting material.

In a semiconductor device having the foregoing structure, the memory element 221 has a simple structure in which an organic compound layer is formed between a pair of conductive layers (a first conductive layer and a second conductive layer). Consequently, the semiconductor device can be easily manufactured, and so an inexpensive semiconductor device or the manufacturing method thereof can be provided. In addition, high integration of the semiconductor device according to the present invention is easy and a semiconductor device having a memory circuit with large capacity and the manufacturing method thereof can be provided.

There is a case in which data is written with an optical action using laser light to a layer having a plurality of memory elements. In that case, a layer having a plurality of memory elements is formed so as not to cover a conductive layer over the substrate.

The semiconductor device according to the present invention has a structure in which a layer having a plurality of memory elements is stacked over a layer having a plurality of field effective transistors including a single crystal semiconductor layer as a channel portion. By applying the foregoing structure, a small semiconductor device can be provided.

Further, the semiconductor device according to the invention includes a memory circuit in which data is written by an optical action or an electrical action. The memory circuit is nonvolatile and data can be additionally written. Consequently, forgery can be prevented because data cannot be rewritten though data can be additionally written. Therefore, a semiconductor device in which a high function and a high added value are realized and the manufacturing method thereof can be provided.

In addition, a top gate type TFT is explained as an example here, the present invention can be applied regardless of the TFT structure. For example, the present invention can be applied to a bottom gate type (inversely staggered) TFT and a staggered TFT.

The present invention is not limited to the TFT structure shown in FIG. 2B. If necessary, it can take a lightly doped drain (LDD) structure which has an LDD region between a channel formation region and a drain region (or a source region). In the LDD structure, a region into which an impurity element is added in low concentration is provided between a channel formation region and a source or a drain region formed by adding an impurity element in high concentration. The region into which an impurity element is added in low concentration is referred to as an LDD region. Further, a so-called GOLD (Gate-drain Overlapped LDD) structure in which an LDD region is overlapped with a gate electrode via a gate insulating film can be employed.

This embodiment mode can be freely combined with the embodiment mode 1.

EMBODIMENT MODE 3

Figure 4:
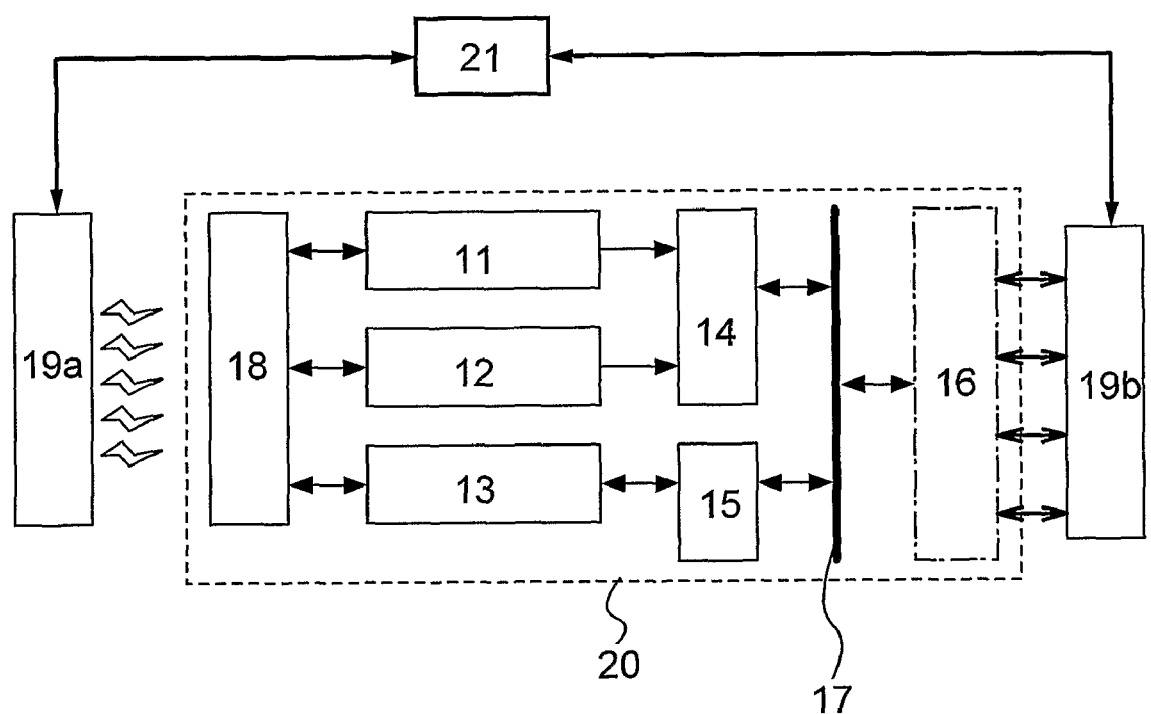
FIG. 4 is a block diagram of a semiconductor device according to the present invention.

FIG. 4 is a block diagram of the semiconductor device according to the present invention.

As shown in FIG. 4, a semiconductor device 20 surrounded by a dotted line can exchange data without contact. The semiconductor device 20 has a power source circuit 11, a clock generator circuit 12, a data demodulator/modulator circuit 13, a controlling circuit 14 for controlling other circuits, an interface circuit 15, a memory circuit 16, a data bus 17, and an antenna (antenna coil) 18.

The power source circuit 11 is a circuit for generating electric current and electric voltage which is supplied to each circuit inside the semiconductor device 20 based on an alternating signal from the antenna 18. The clock generator circuit 12 is a circuit for generating various clock signals which are supplied to each circuit in the semiconductor device 20 based on an alternating signal inputted from the antenna 18. The data demodulator/modulator circuit 13 has a function for demodulating/modulating a data which is exchanged with an electrical reader/writer 19a. The controlling circuit 14 has a function for controlling the memory circuit 16. The antenna 18 has a function for sending/receiving an electromagnetic field or a radio wave. The electrical reader/writer 19a has a function for communicating with the semiconductor device, controlling the semiconductor device, and processing the data. It is to be noted that the structure of the semiconductor device is not limited to the foregoing structures and may have an additional element such a limiter circuit of a power source voltage or a hard ware for processing a code.

The memory circuit 16 has a memory element having a pair of conductive layers and an organic compound layer formed therebetween. In a memory element in which an organic compound layer is interposed between conductive layers, data can be read by an optical reader/writer 19b.

By collating the data read through the optical reader/writer 19b and the electrical reader/writer 19a by a collating means 21, an error in writing and reading can be prevented.

Data can be written to a memory circuit by both of the optical reader/writer 19b and the electrical reader/writer 19a.

The memory circuit 16 may only have memory elements having a pair of conductive layers and an organic compound layer interposed therebetween or may have a memory circuit having another structure. Another structure indicates one or a plurality of memory circuits selected from mask ROM (Read Only Memory), PROM (Programmable Read Only Memory), EPROM (Electrically Programmable Read Only Memory), and/or EEPROM (Electrically Erasable Programmable Read Only Memory).

Although FIG. 4 shows the electrical reader/writer 19a and the optical reader/writer 19b, the identifying means is not limited thereto as long as the different kinds of the identify means are used. Alternatively, three or more identify means can be used.

This embodiment mode can be freely combined with the embodiment modes 1 and 2.

The present invention having the foregoing structure is further described in the following examples.

EXAMPLE 1

Figure 6A:
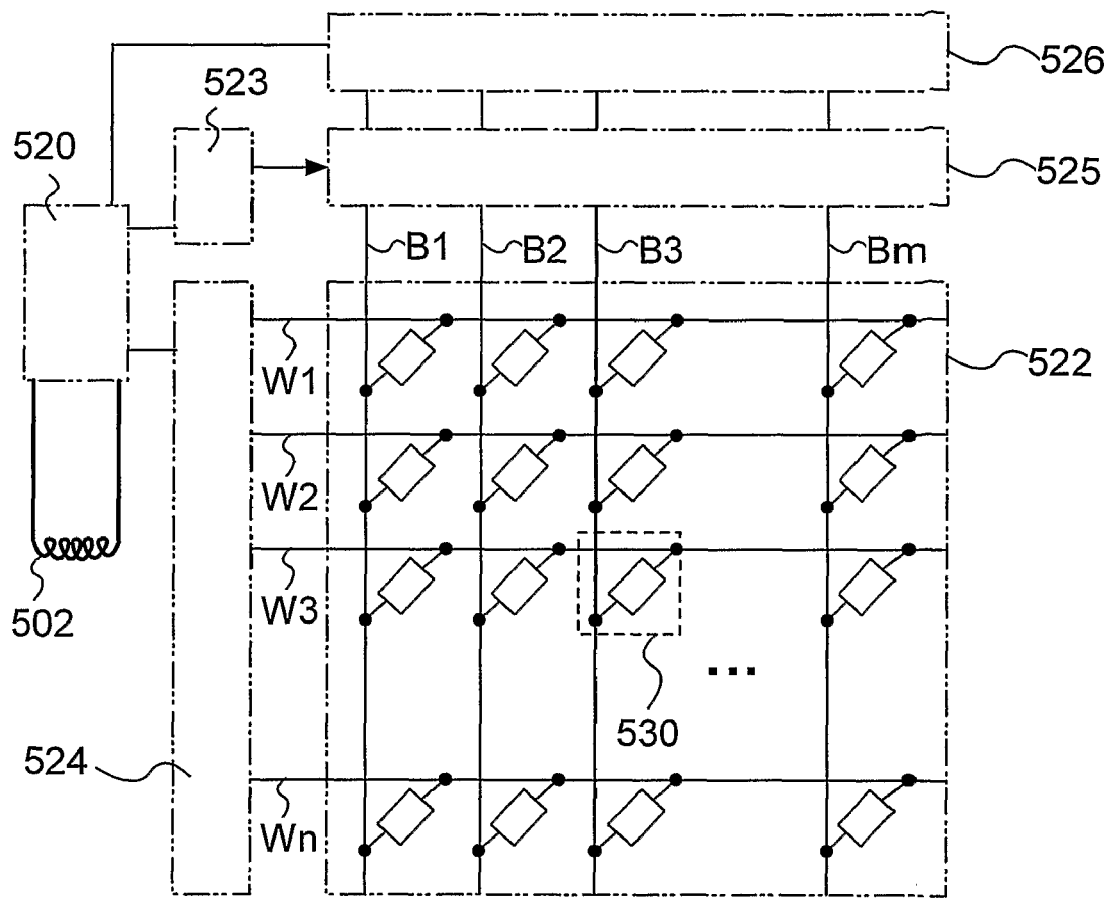
FIGS. 6A and 6B are equivalent circuit diagrams of a memory portion in a semiconductor device according to the present invention.
Figure 6B:
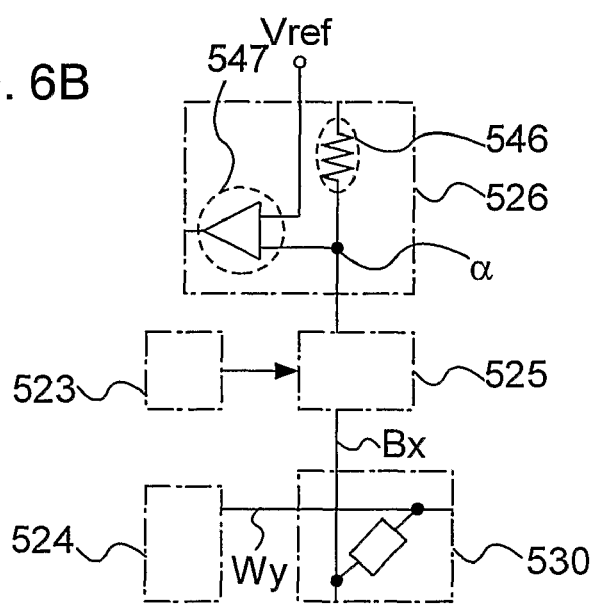

The structure and operation of a semiconductor device according to the present invention is described with reference to FIGS. 6A and 6B. The semiconductor device according to the present invention has a memory portion and an antenna portion. The memory portion has a memory cell array 522 in which memory cells are arranged in matrix, decoder circuits 523 and 524, a selector circuit 525, and a reading and writing circuit 526. The memory cell has a memory element 530. The antenna portion which sends and receives data without contact has an antenna 502 and an integrated circuit 520, which is connected to the antenna.

Figure 5A:
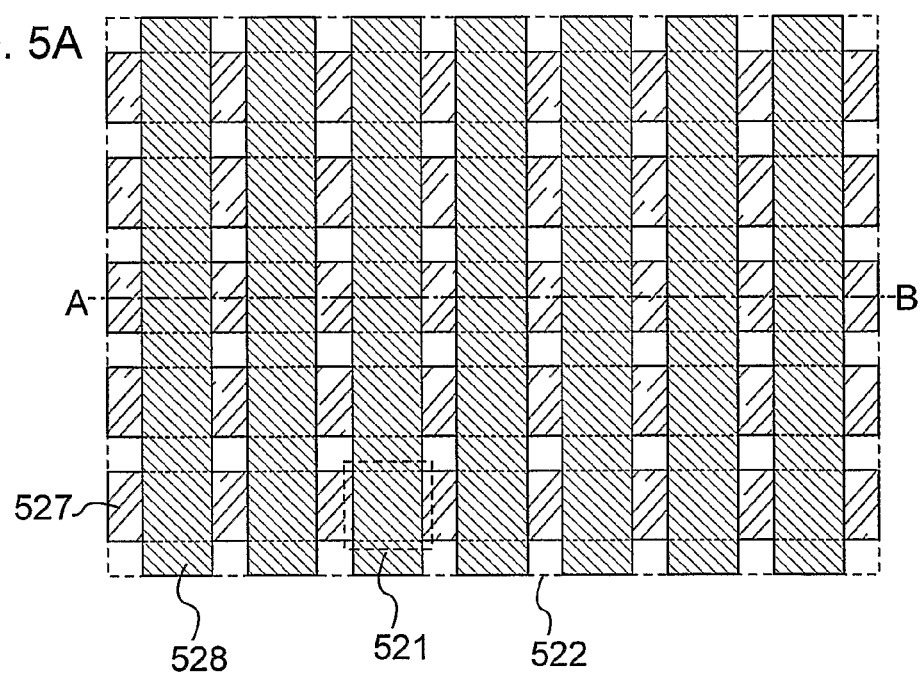
Figure 5C:
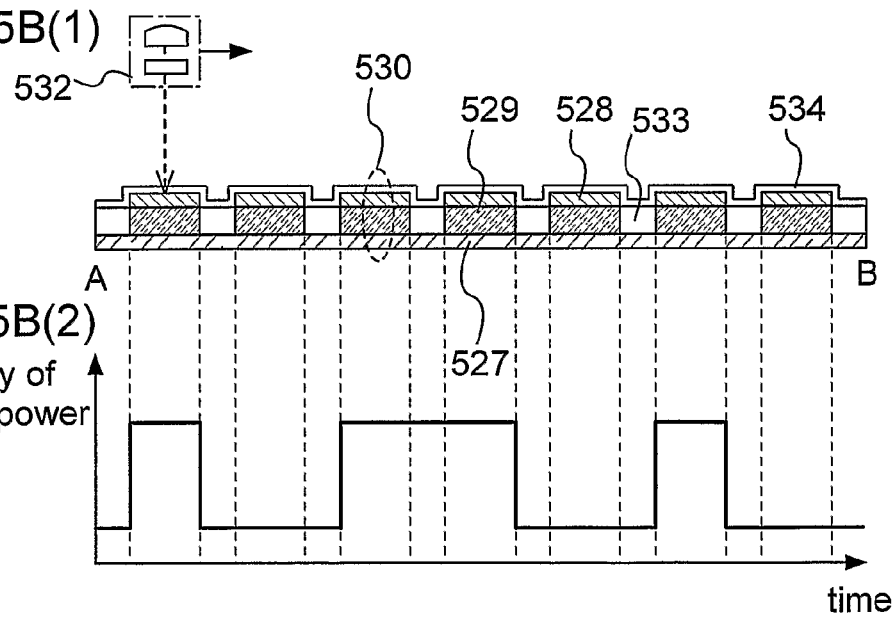
Figure 5C:
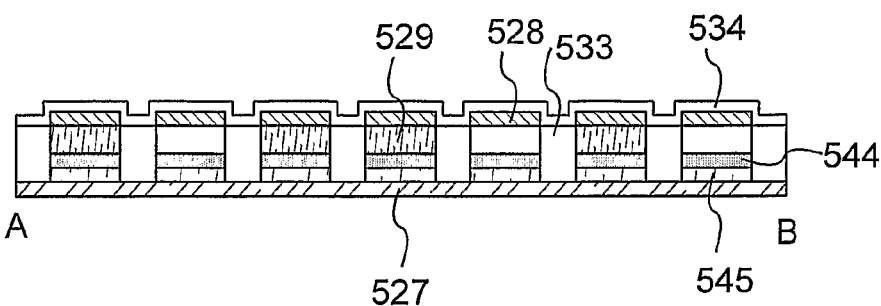

Next, a top structure and a cross sectional structure of the actually manufactured memory cell array 522 are explained (FIGS. 5A and 5C).

The memory element 530 has a first conductive layer 527 for forming a bit line Bx ($1 \leq x \leq m$), a second conductive layer 528 for forming a word line Wy ($1 \leq y \leq n$), and an organic compound layer 529 provided between the first conductive layer 527 and the second conductive layer 528 (FIG. 5A). The stacked body composed of the first conductive layer 527, the organic compound layer 529, and the second conductive layer 528 corresponds to the memory element 530. An insulating layer 533 is formed between the neighboring organic compound layers 529. An insulating layer 534 is formed over the plurality of memory elements 530. The first conductive layer 527 for forming the bit line Bx extends in a first direction and the second conductive layer 528 for forming the word line Wy extends in a second direction which is perpendicular to the first direction. In other words, the first conductive layer 527 and the second conductive layer 528 are formed to be stripe shaped so that the first conductive layer 527 and the second conductive layer 528 intersect with each other.

In this example, data is written to the memory element 530 by an optical action. Therefore either or both of the first conductive layer 527 and the second conductive layer 528 need to have a light transmitting property. The conductive layer having a light transmitting property is formed from a light transmitting conductive material such as an indium tin oxide (ITO) or formed from a conductive material which does not have a light transmitting property to have a thickness through which light is transmitted.

The organic compound layer 529 included in a memory element can be formed from a material having a highly hole transporting property such as an aromatic amine-based (that is, a bond of benzene ring-nitrogen is included) compound such as 4,4'-bis[N-(1-naphthyl)-N-phenyl-amino]biphenyl (abbreviated to α-NPD), 4,4'-bis[N-(3-methylphenyl)-N-phenyl-amino]-biphenyl (abbreviated to TPD), 4,4',4''-tris(N, N-diphenyl-amino)triphenylamine (abbreviated to TDATA), 4,4',4''-tris[N-(3-methylphenyl)-N-phenyl-amino]-triphenylamine (abbreviated to MTDATA), or 4,4'-bis(N-(4-(N,N-di-m-tolylamino)phenyl)-N-phenylamino)biphenyl (abbreviated to DNTPD) or a phthalocyanine compound such as phthalocyanine (abbreviated to $H_2Pc$), copper phthalocyanine (abbreviated to CuPc), or vanadyl phthalocyanine (abbreviated to VOPc) can be used.

Further, a material having a highly electron transporting property can be used as the organic compound material for the organic compound layer 529 included in a memory element. For example, a material formed from a metal complex or the like having a quinoline skeleton or a benzoquinoline skeleton, such as tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), or bis(2-methyl-8-quinolinolato)-4-phenylphenolato-aluminum (abbreviated to BAlq) or a material such as a metal complex having an oxazole-based or thiazole-based ligand, such as bis[2-(2-hydroxyphenyl)-benzoxazolato]zinc (abbreviated to $Zn(BOX)_2$) or bis[2-(2-hydroxyphenyl)-benzothiazolato]zinc (abbreviated to $Zn(BTZ)_2$) may be used. Further, in addition to a metal complex, a compound or the like such as 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), or bathocuproin (abbreviated to BCP) may be used.

Further, as other organic compound materials for the organic compound layer 529 included in a memory element, 4-dicyanomethylene-2-methyl-6-[2-(1,1,7,7-tetramethyl-9-julolidyl)ethenyl]-4H-pyran (abbreviated to DCJT), 4-dicyanomethylene-2-t-butyl-6-[2-(1,1,7,7-tetramethyljulolidine-9-yl)ethenyl]-4H-pyran, periflanthene, 2,5-dicyano-1,4-bis[2-(10-methoxy-1,1,7,7-tetramethyljulolidine-9-yl)ethenyl]benzene, N,N'-dimethylquinacridone (abbreviated to DMQd), coumarin 6, coumarin 545T, tris(8-quinolinolato)aluminum (abbreviated to $Alq_3$), 9,9'-bianthlyl, 9,10-diphenylanthracene (abbreviated to DPA), 9,10-bis(2-naphthyl)anthracene (abbreviated to DNA), 2,5,8,11-tetra-t-buthylperylene (abbreviated to TBP), or the like can be used. An anthracene derivative such as 9,10-di(2-naphthyl)-2-tert-butylanthracene (abbreviated to t-BuDNA); a carbazole derivative such as 4,4'-bis(N-carbazolyl)biphenyl (abbreviated to CBP); a metal complex such as bis[2-(2-hydroxyphenyl)pyridinato]zinc (abbreviated to $Znpp_2$) or bis[2-(2-hydroxyphenyl)benzoxazolate]zinc (abbreviated to ZtBOX); or the like can be used as a material to be a base material in the case of forming a layer in which the foregoing organic material is diffused. Alternatively, tris(8-quinolinolato)aluminum (abbreviated to $Alq_3$), 9,10-bis(2-naphthyl)anthracene (abbreviated to DNA), bis(2-methyl-8-quinolinolato)-4-phenylphenolate-aluminum (abbreviated to BAlq), or the like can be used.

Further, as other materials for the organic compound layer 529 included in the memory element, polyethylene dioxythipophene (abbreviated to PEDOT) doped with polystyrene sulfonate (abbreviated to PSS), polyaniline (abbreviated to PAni), polyvinyl carbazole (abbreviated to PVK), or the like can be used.

Further, a material in which electric resistance changes by an optical action or an electric action can be used. For example, a conjugated polymer doped with a compound which generates acid by absorbing light (photoacid generator) can be used. As the conjugated polymer, polyacetylenes, polyphenylene vinylenes, polythiophenes, poly anilines, polyphenylene ethinylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like can be used.

Next, an operation of writing data to a memory circuit having the foregoing structure is explained. Data is written by an optical action. The organic compound layer 529 is irradiated with laser light from a conductive layer side having a light transmitting property (second conductive layer 528 here) by a laser irradiation apparatus 532 to write data.

Laser light may be irradiated to the whole memory cell 521 or may be irradiated to the memory cell 521 selectively. For example, when the organic compound layer 529 which is just formed is in an amorphous state, the organic compound layer 529 is not irradiated with laser light to leave it in an amorphous state and the organic compound layer 529 is not irradiated with laser light to change it to be in a crystal state. (FIG. 5B(2)) That is, data may be written by conducting laser light irradiation selectively. When the organic compound layer is selectively irradiated with laser light, it is preferable to use a pulsed oscillation laser irradiation apparatus.

For more detail, the organic compound layer 529 included in the selected memory element 530 is selectively irradiated with laser light to destroy or crystallize the organic compound layer 529. The organic compound layer 529 which is destroyed or crystallized changes its optical property. In the case of the crystallized organic compound layer, the conductivity thereof is increased and the electrical resistance value is significantly lowered compared with that of other memory elements. On the other hand, the destroyed organic compound layer is insulated; therefore, the electrical resistance value thereof is significantly increased compared with that of other memory elements. Data is written by utilizing the phenomenon that an optical property and an electric resistance value of the memory element 530 are changed by laser light irradiation. For example, in the case where a memory element which is not irradiated with laser light is assumed to have data "0", a memory element is irradiated with laser light to be changed the optical property or the electrical resistance value in the case of writing data "1".

In the case of using a conjugated polymer doped with a compound which generates acid by absorbing light (photoacid generator) as the organic compound layer 529, conductivity increases only in the portion of being irradiated with laser light and a portion of not being irradiated with laser light has no conductivity when the organic compound layer is irradiated with laser light. Therefore, data is written by utilizing the phenomenon that the resistance value of the memory element 530 is changed by irradiating a selected organic compound layer 529 with laser light. For example, in the case where a memory element which is not irradiated with laser light is assumed to have data "0", a memory element is selectively irradiated with laser light to heighten the conductivity in the case of writing data "1".

As a different structure from the foregoing structure, a rectifying element may be provided between the first conductive layer 527 and the organic compound layer 529 (FIG. 5C). The rectifying element refers to a transistor or a diode to which a gate electrode and a drain electrode are connected. Here, a PN junction diode including semiconductor layers 544 and 545 is provided. Either the semiconductor layers 544 or 545 is an n-type semiconductor while the other is a p-type semiconductor. Thus, an error can be reduced and margin of reading can be enhanced by providing the rectifying diode since current flows in only one direction. It is noted that the diode is not restricted to a PN junction diode when providing a diode. A diode having other structures such as a PIN junction diode or an avalanche diode may be used.

Next, an operation of reading data electrically is explained with reference to FIGS. 6A and 6B. Here, a reading and writing circuit 526 has a resistance element 546 and a sense amplifier 547. However, the structure of the reading and writing circuit 526 is not restricted to the foregoing structures, and may have any structure.

Data can be read by applying voltage between the first conductive layer 527 and the second conductive layer 528 to read a resistance value of the memory element 530. For example, as described above, when data is written by laser light irradiation to the organic compound layer 529, data is read by electrically reading the difference in resistance values between a memory element to which an optical action is not applied and a memory element to which an optical action is applied.

Similarly, when a conjugated polymer doped with a compound which generates acid by absorbing light (photoacid generator) is used for the organic compound layer 529, data is read by electrically reading the difference in resistance values between a memory element to which an optical action is not applied and a memory element to which an optical action is applied.

In the case of reading data from the memory element 530 disposed in an x-th row and a y-th column which is selected from the plurality of memory elements 530 in the memory cell array 522, the bit line Bx in the x-th row and the word line Wy in the y-th column are selected first by the decoder circuits 523 and 524, and the selector circuit 525. Then, the memory element 530 and a resistance element 546 are connected serially. When the memory element 530 is regarded as a resistance element and voltage is applied to both ends of the two serially connected resistance elements, the electric potential of a node α is resistance-divided electric potential in accordance with the resistance value of the memory element 530. The electric potential of the node α is applied to the sense amplifier 547. In the sense amplifier 547, either information "0" or "1" is included is judged. Thereafter, the signal having information "0" or "1" judged by the sense amplifier 547 is sent to the external portion.

According to the above method, the information of the memory element 530 is read in its voltage value by utilizing the difference in the resistance value and the resistance division. Reading may be conducted by comparing the current values. In that case, reading is conducted by utilizing a difference between the memory element 530 to which an electrical action is applied and the memory element 530 to which an electrical action is not applied. Thus data may be read by reading a difference in current values electrically.

As a different structure from the above structure, a rectifying element may be provided between the first conductive layer 527 and the organic compound layer 529. The rectifying element refers to a transistor to which a gate electrode and a drain electrode are connected or a diode. An error can be reduced and margin of reading can be enhanced by providing a rectifying diode since current flows in only one direction. It is noted that when providing a diode, the diode is not restricted to a PN junction diode. A diode having other structures such as a PIN junction diode or an avalanche diode may be used.

An operation of reading data by an optical action is described. As described in embodiment mode 1, the memory element according to the present invention is arranged in matrix, and has a pair of electrodes either or both of them has/have a light transmitting property and an identification surface to identify the organic compound layer 529. An optical property of the organic compound layer 529 is changed by writing data, a pattern is formed on the identification surface by a memory element to which data is written and a memory element to which data is not written. Data is read by taking in the pattern to the optical reading device and analyzing the data.

Thus, in a semiconductor device of this example, data can be read by both of an optical reading device and an electrical reading device and an error in reading can be reduced by collating data read by both of an optical reading device and an electrical reading device.

In a semiconductor device of this example, data can be written by both of an optical writing device and an electrical writing device and an error in writing can be reduced.

In addition, a memory circuit included in a semiconductor device according to the present invention has a memory element with a simple structure in which an organic compound layer is provided between a pair of conductive layers; therefore, a manufacturing process thereof is simple and an inexpensive semiconductor device and the manufacturing method thereof can be provided. High integration of the semiconductor device according to the present invention is easy, therefore, a semiconductor device having a memory circuit with a large capacity and manufacturing method thereof can be provided.

In addition, in a memory circuit included in a semiconductor device according to the present invention, data is written by an optical action or an electrical action and the memory circuit is nonvolatile and data can be additionally written. According to the foregoing features, forgery is prevented and a semiconductor device which is able to be written additionally, while security is ensured can be provided. Consequently, a semiconductor device in which a high function and a high added value are realized and the manufacturing method thereof can be provided.

This example can be freely combined with the embodiment modes 1 to 3.

EXAMPLE 2

In this example, a laser irradiation apparatus which is used for writing data to a memory circuit by an optical action is described with reference to FIG. 7.

Figure 7:
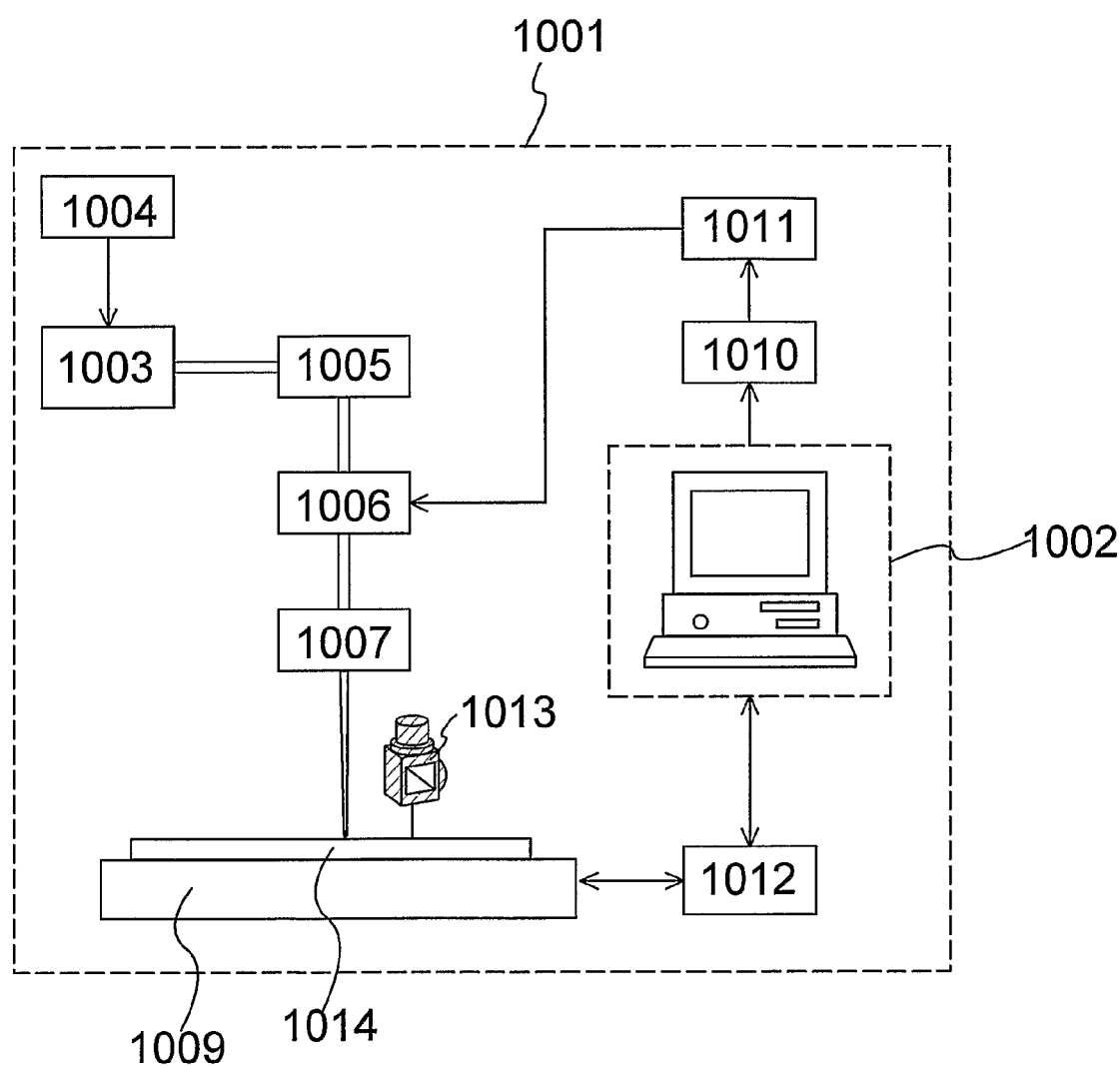
FIG. 7 is an explanatory view of a laser irradiation apparatus according to the present invention.

A laser irradiation apparatus 1001 is provided with a computer 1002 for conducting various controls when laser light is irradiated; a laser oscillator 1003 for laser light irradiation; a power supply 1004 of the laser oscillator 1003; an optical system 1005 for attenuating the laser light; an acousto-optic modulator 1006 for modulating the intensity of the laser light; an optical system 1007 including a lens for shrinking the cross section of the laser light, a mirror for changing a light path, and the like; a movement mechanism 1009 having a X axis stage and a Y axis stage; a D/A converter 1010 for converting control data outputted from the computer 1002; a driver 1011 for controlling the acousto-optic modulator 1006 depending on the analog voltage outputted from the D/A converter; a driver 1012 for outputting a driving signal for driving the movement mechanism 1009; and an autofocusing mechanism 1013 for focusing laser light on an object to be irradiated (FIG. 7). A laser oscillator which can oscillate ultraviolet light, visible light, or infrared light can be used as the laser oscillator 1003. An excimer laser oscillator such as KrF, ArF, XeCl, or Xe; a gas laser oscillator such as He, He—Cd, Ar, He—Ne, or HF; a solid laser oscillator using a crystal such as YAG, GdVO$_4$, YVO$_4$, YLF, or YAlO$_3$ doped with Cr, Nd, Er, Ho, Ce, Co, Ti, or Tm; or a semiconductor laser oscillator such as GaN, GaAs, GaAlAs, or InGaAsP can be used as the laser oscillator.

Next, an operation of the laser irradiation apparatus 1001 having the above structure is described. When the movement mechanism 1009 is equipped with a substrate 1014, the computer 1002 detects a position of the memory element which is to be irradiated with laser light by a camera which is not shown in the drawing. Then, the computer 1002 generates movement data for moving the movement mechanism 1009 based on the detected position data. Thereafter, the computer 1002 controls the amount of light which is to be irradiated from the acousto-optic modulator 1006 through the driver 1011, and accordingly, laser light irradiated from the laser oscillator 1003 is attenuated by the optical system 1005. Then, an amount of light is controlled so that a predetermined amount of light is obtained using the acousto-optic modulator 1006. On the other hand, the light path and the shape of beam spot of the laser light outputted from the acousto-optic modulator 1006 are changed with the optical system 1007 and the laser light is converged by the lens. Then, the substrate 1014 is irradiated with the laser light. At this time, the movement mechanism 1009 is controlled to move toward an X direction and a Y direction in accordance with the movement data generated by the computer 1002. As a result, a predetermined position is irradiated with the laser light, and the light energy density of the laser light is converted to the heat energy. Thus, the memory element provided over the substrate 1014 is selectively irradiated with laser light. It is to be noted that laser light irradiation is conducted by moving the movement mechanism 1009; however, laser light may be moved to an X direction and a Y direction by adjusting the optical system 1007.

In a semiconductor device according to the present invention, data can be easily written using a laser irradiation apparatus having the foregoing structure, and so data can be written in large amount and in short time.

This example can be freely combined with the embodiment modes 1 to 3 and the example 1.

EXAMPLE 3

In this example, a result of an experiment in which a memory element is formed over a substrate and a change of the optical property of the memory element is studied when data is written thereto by an electrical action.

The memory element is an element formed by stacking a first conductive layer, a layer containing a metal oxide and an organic compound material, an organic compound layer, and a second conductive layer sequentially over a substrate.

As a metal oxide, either a material which shows an electron accepting property to a hole transporting material or a material which shows an electron donor property to an electron transporting material is preferably used. As an example of a metal oxide, in addition to a molybdenum oxide, a vanadium oxide, a ruthenium oxide, a cobalt oxide, a copper oxide, and the like; a lithium oxide, a calcium oxide, a magnesium oxide, a sodium oxide, and the like; and an alkaline metal oxide, an alkaline-earth metal oxide, and the like; can be nominated.

The metal oxide is preferably selected from hole transporting materials and electron transporting materials.

In a layer containing a metal oxide and an organic compound material, either a hole transporting material or an electron transporting material is preferably used as the organic compound material. Here, a hole transporting material refers to a material having a higher hole transporting property than an electron transporting property and an electron transporting material refers to a material having a higher electron transporting property than a hole transporting property. In the layer containing a metal oxide and an organic compound material, when the metal oxide accepts electrons from a hole transporting material, the organic compound material preferably is a hole transporting material. In the layer containing a metal oxide and an organic compound material, when the metal oxide shows an electron donor property to an electron transporting material, the organic compound material preferably is an electron transporting material.

In this example, a first conductive layer is formed from a transparent conductive film containing a silicon oxide and an indium tin oxide. And the layer containing a metal oxide and an organic compound material is formed using MoOx and 4,4'-bis[N-(1-naphthyl)-N-phenylamino]biphenyl (abbreviation: NPB) at a molar ratio of 1:1. The layer containing a metal oxide and an organic compound material is formed to have a thickness of 80 nm. An organic compound layer formed over the layer containing a metal oxide and an organic compound material is formed from 4,4'-bis{N-[4-(N,N-di-m-tolylamino)phenyl]-N-phenylamino}biphenyl (abbreviation: DNTPD) to have a thickness of 50 nm. A second conductive layer is formed from aluminum.

A plurality of the foregoing memory elements is arranged in matrix to form a memory cell array. A memory circuit is formed of a memory cell array, a decoder circuit, a selector circuit, and a reading and writing circuit. One of memory elements are selected by a decoder circuit and a selector circuit. The predetermined voltage is applied to the selected memory element to let a large current flow, thereby a pair of conductive layers in the memory elements is short circuited. The electrical resistance value of the short circuited memory element is significantly lowered compared with that of other memory elements to which voltage is not applied. Thus, data is written by utilizing the change of the electrical resistance value when an electrical action is applied. For example, when a memory element to which an electrical action is applied is assumed to have data "0", data "1" is written to a memory element by applying voltage to the selected memory element to let a large current flow and thereby making the memory element short circuit.

Figure 8:
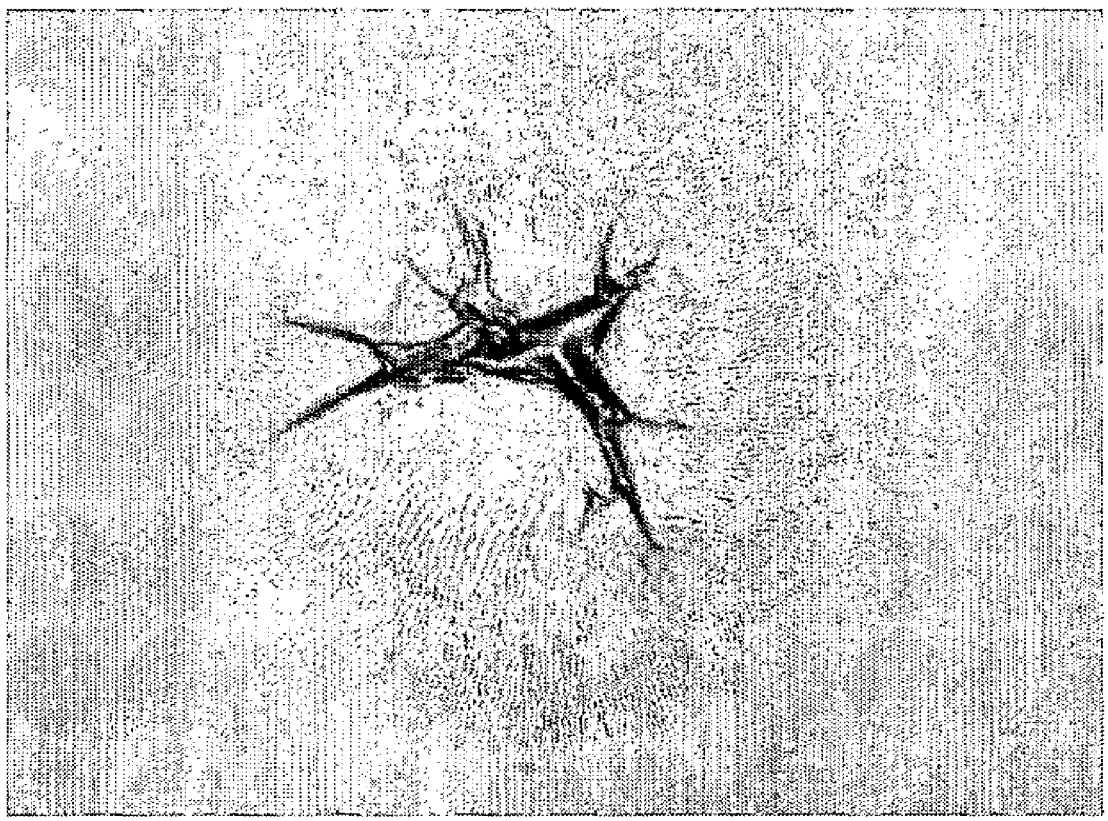
FIG. 8 is a photograph of a part of a memory element to which voltage is applied.

When predetermined voltage is applied to a first conductive layer and a second conductive layer of a memory element, a dielectric breakdown occurs and the pair of the conductive layers is short circuited to be changed optically. FIG. 8 is an enlarged photograph of a part of the short circuited memory element. As shown in FIG. 8, the memory element is discolored partially and the discolored part is short circuited.

Figure 9:
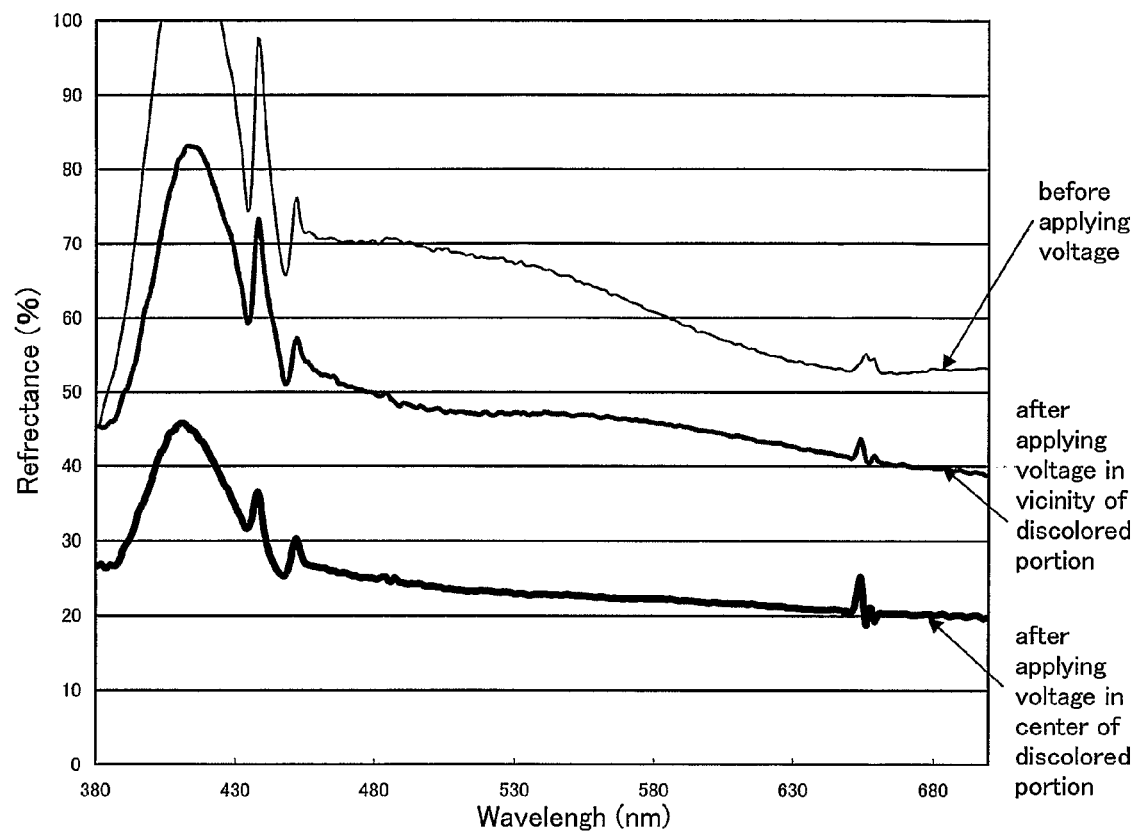
FIG. 9 is a graph of a reflectance spectrum of a memory element before and after voltage is applied.

FIG. 9 shows a reflectance spectrum measured to find a difference of the memory element before and after current is applied. As shown in FIG. 9, a center of a discolored part to which current is applied has half or less reflectance of the reflectance before current is applied. Also, the part around the discolored part to which current is applied has less reflectance compared with the reflectance before current is applied.

Thus, a memory element which is not discolored can be assumed to have data "0", while a memory element which is discolored may be assumed to have data "1". The data is identified by an optical reading device such as an image scanner and a CCD camera. Whether data is written to the memory element or not can be seen by human eyes.

In this example, a data is written to a memory element by applying a predetermined voltage to make the memory element short circuit, but present invention is not limited thereto. For example, when a dielectric breakdown of an organic compound layer interposed between a pair of conductive layers occurs by laser light irradiation to a memory element, data is written to the memory element.

This example can be freely combined with the embodiment modes 1 to 3 and the examples 1 and 2.

EXAMPLE 4

In this example, a measurement result of a current voltage characteristic in the case where a memory element is formed over a substrate and data is written thereto by an electrical action is explained. A memory element is formed by stacking a first conductive layer, a first organic compound layer, a second organic compound layer, and a second conductive layer sequentially over a substrate. The first conductive layer is formed from a compound of a silicon oxide and an indium tin oxide (this material may be abbreviated to NITO), the first organic compound layer is formed from 4,4'-bis[N-(3-methylphenyl)-N-phenyl-amino]-biphenyl (this material may be abbreviated to TPD), and the second conductive layer is formed from aluminum. The first organic compound layer is formed to have a thickness of 10 nm and the second organic compound layer is formed to have a thickness of 50 nm.

Figure 10:
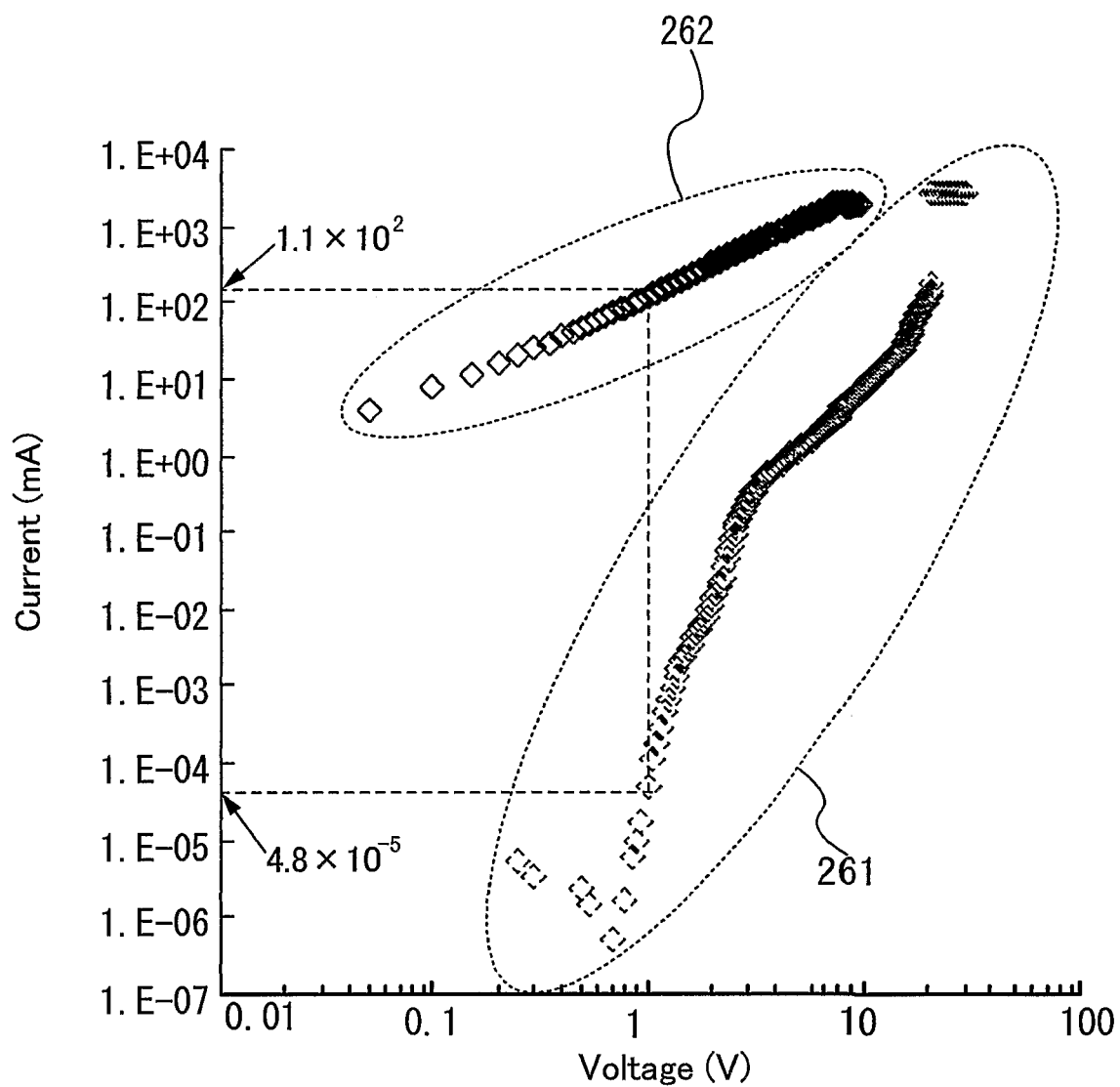
FIG. 10 is a graph showing a current-voltage characteristic of a memory element.

First, a measurement result of the current-voltage characteristics of the memory element before and after writing data by an electric action is explained with reference to FIG. 10. In FIG. 10, a horizontal axis indicates a voltage value, a vertical axis indicates a current value, plots 261 indicate the current-voltage characteristic of the memory element before writing data by an electric action, and plots 262 indicate the current-voltage characteristic of the memory element after writing data by an electric action. FIG. 10 shows a significant change in the current-voltage characteristics of the memory element before and after writing data. For example, the current value before writing data is $4.8 \times 10^{-5}$ mA, whereas the current value after writing data is $1.1 \times 10^{2}$ mA at an applied voltage 1 V; accordingly, the current value changes for seven-digit before and after writing data. As described above, the resistance value of the memory element changes before and after writing data, and the memory element can serve as a memory circuit when the change of the resistance value of this memory element is read in a voltage value or a current value.

In the case of using a memory element as described above as a memory circuit, a predetermined voltage value (a voltage value which is enough to keep the memory element from being short circuited) is applied to the memory element each time reading operation of data is conducted, then the resistance value is read. Therefore, the current-voltage characteristic of the above memory element is required to have a characteristic which does not change even through reading operation is repeatedly conducted, that is, even though a predetermined voltage value is repeatedly applied. A measurement result of current-voltage characteristics of memory elements after reading data is explained with reference to FIG. 11. In this measurement, current-voltage characteristic of the memory elements is measured each time reading operation of data is conducted. The reading operation of data is conducted five times in total; therefore, the current-voltage characteristics of the organic memory elements are measured five times in total. The measurement of the current-voltage characteristics is conducted to two memory elements, a memory element in which a resistance value is changed by writing data by an electric action and a memory element in which a resistance value is not changed.

Figure 11:
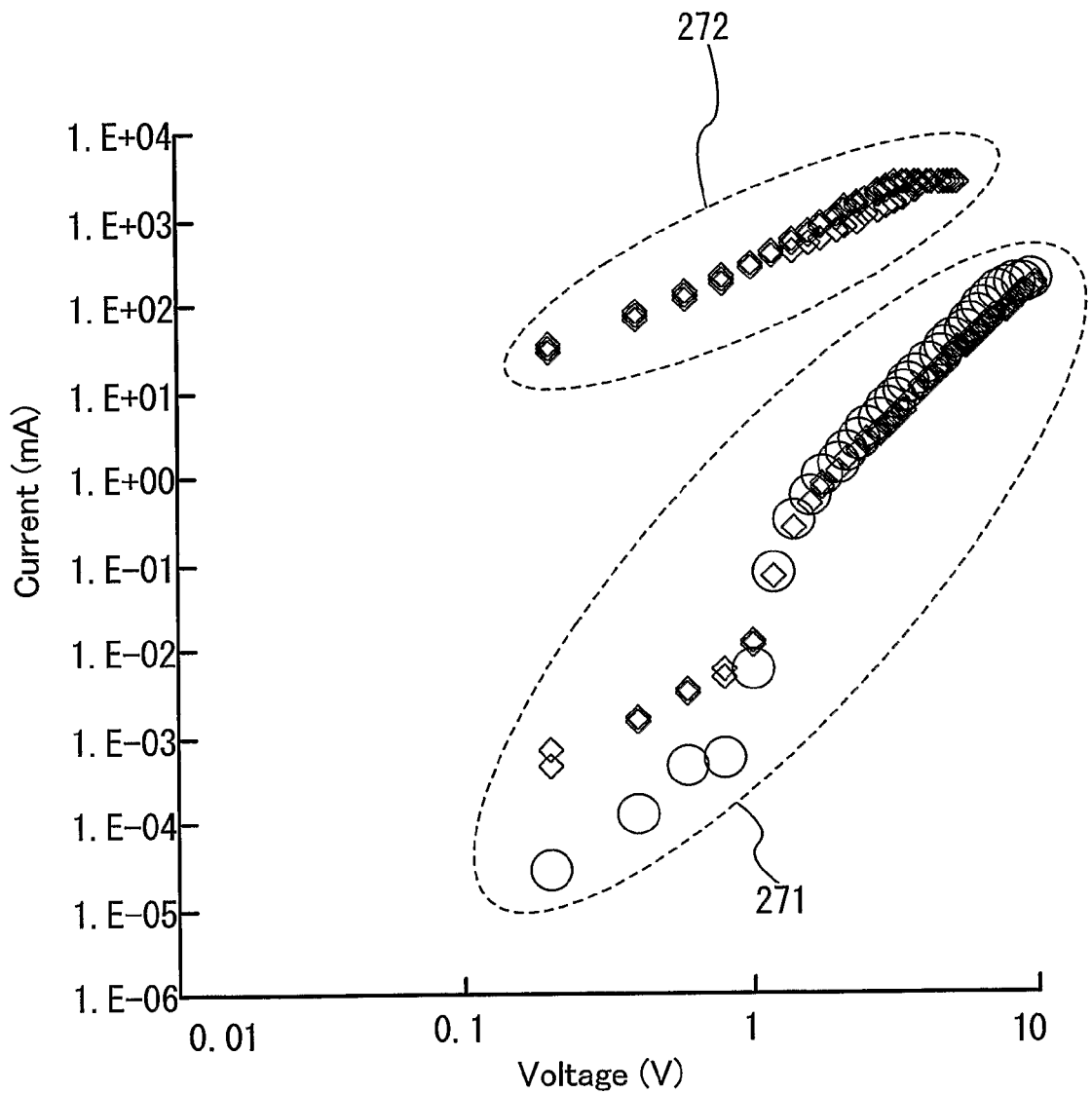
FIG. 11 is a graph showing a current-voltage characteristic of a memory element.

In FIG. 11, a horizontal axis indicates a voltage value, a vertical axis indicates a current value, plots 271 indicate the current-voltage characteristic of the organic memory element in which a resistance value is changed by writing data by an electric action, and plots 272 indicate the current-voltage characteristic of the memory element in which a resistance value is not changed. As shown in the plots 271, the current-voltage characteristic of the memory element in which the resistance value is not changed shows a favorable reproducibility especially at a voltage value of 1 V or more. Similarly, as shown in the plots 272, the current-voltage characteristic of the memory element in which a resistance value is changed by writing data shows a favorable reproducibility especially at a voltage value of 1 V or more. From the foregoing results, the current-voltage characteristics are not changed even after reading operation of data is repeatedly conducted a plurality of times. Therefore, the foregoing memory element can be used as a memory circuit.

In a memory element to which data is written, the film thickness of the organic compound layer changes partly compared with that of before writing data. The change of the film thickness can be observed by an optical reading device.

A measurement result of a change in a film thickness of a memory element in which an organic compound layer is a single layer before and after writing data is as follows.

A memory element is formed by stacking a first conductive layer (a bottom electrode), an organic compound layer, and a second conductive layer (a top electrode) sequentially over a substrate provided with a base insulating film having a thickness of 140 nm. The first conductive layer is formed from a compound of a silicon oxide and an indium tin oxide; the organic compound layer is formed from 4,4'-bis[N-(3-methylphenyl)-N-phenyl-amino]biphenyl (TPD), and the second conductive layer is formed from aluminum. The bottom electrode is formed to have a film thickness of 105 nm, and a top electrode is formed to have a film thickness of 270 nm. The organic compound layer (TPD) is formed to have a film thickness of 50 mm. The size of the element is 2 mm×2 mm.

Figure 12:
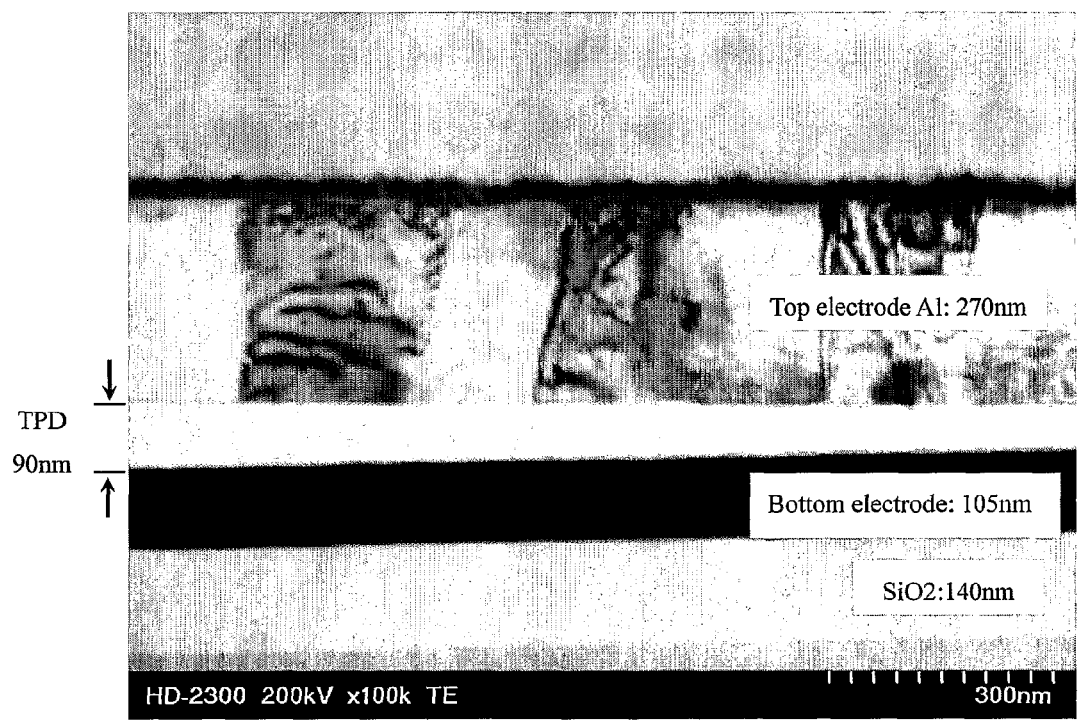
FIG. 12 is a TEM photograph of a cross-sectional view of a memory element after voltage is applied.
Figure 13:
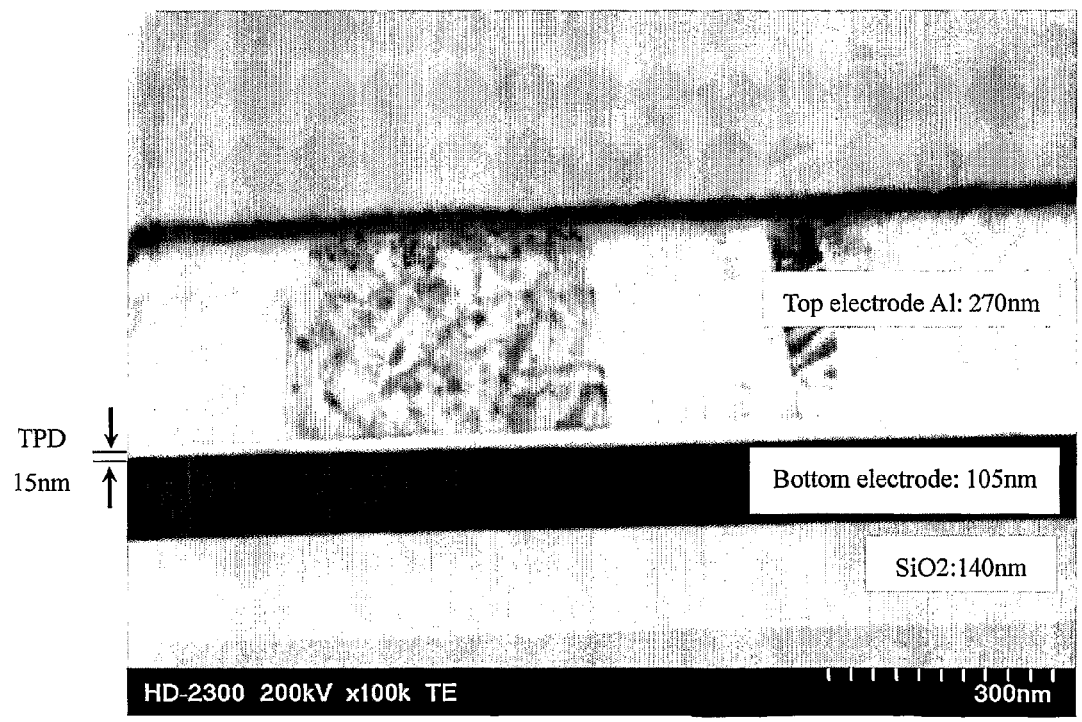
FIG. 13 is a TEM photograph of a cross-sectional view of a memory element after voltage is applied.

After data is written to the memory element where the organic compound layer is a single layer by applying voltage, unevenness is formed on the surface of the memory element. TPD which originally has a film thickness of 50 nm has a thickness of 90 nm at the thickest part of TPD and 15 nm at the thinnest part of TPD after data is written. FIG. 12 shows a TEM photograph of a cross-sectional view at the thickest part of TPD and FIG. 13 shows a TEM photograph of a cross-sectional view at the thinnest part of TPD. As described above, a film thickness of an organic compound layer in a memory element changes partly before and after writing data.

This example can be freely combined with the embodiment modes 1 to 3 and the examples 1 to 3.

EXAMPLE 5

In this example, a result of writing data to a memory element portion which is formed over a substrate by making the memory element portion short-circuit by an electrical action is explained.

A memory element portion is formed by stacking a first conductive layer, an organic compound layer (which is formed by stacking a mixed layer formed from an organic compound material and an inorganic compound material and a layer formed from an organic compound material), and a second conductive layer sequentially over a substrate (the structure is referred to as element structure 1 hereinafter). The first conductive layer is formed from a compound of a silicon oxide and an indium tin oxide. The organic compound layer is formed by stacking a mixed layer formed from an organic compound material and an inorganic compound material and a layer formed from an organic compound material. The mixed layer of an organic compound material and an inorganic compound material is formed from α-NPD and $MoO_3$ by co-evaporation. The layer formed from an organic compound material is formed from TPD. The second conductive layer is formed from aluminum.

Next, as an object of comparison with the memory element having the foregoing structure, an element is formed by stacking a first conductive layer, a layer formed from an organic compound material, and a second conductive layer (the structure is referred to as element structure 2 hereinafter) sequentially over a substrate. The first conductive layer is formed from a compound of a silicon oxide and an indium tin oxide. The layer formed from an organic compound material is formed from TPD, the second conductive layer is formed from aluminum. That is, the structure 2 is the structure which is the same as the structure 1 except that the mixed layer formed from an organic compound material and an inorganic compound material is not provided.

Figure 14:
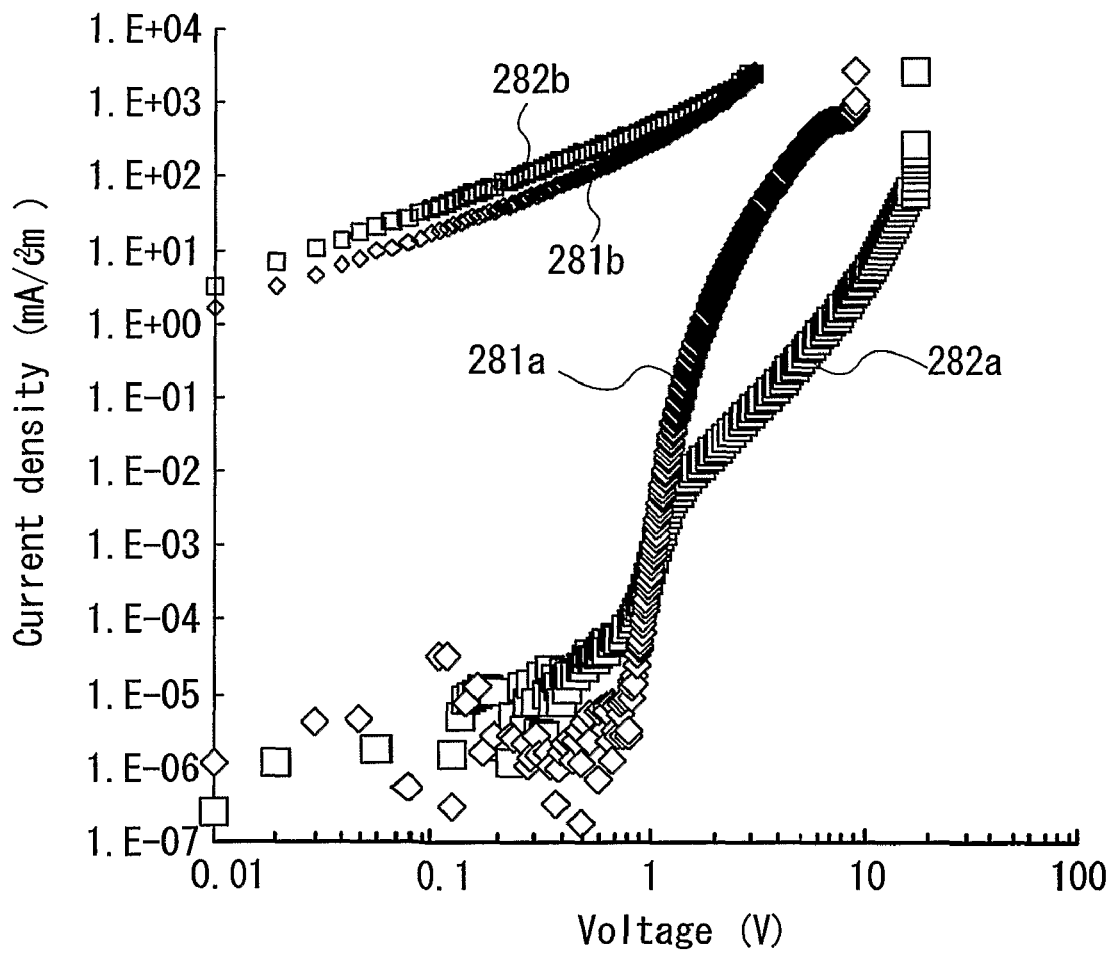
FIG. 14 is a graph showing a current-voltage characteristic of a memory element.

FIG. 14 shows a measurement result of each current-voltage characteristic of the memory element portions having the element structures 1 and 2 before and after writing data by making the memory elements short circuit by an electric action. In FIG. 14, a horizontal axis indicates a voltage value (V), and a vertical axis indicates a current density ($mA/cm^2$). In FIG. 14, plots 281$a$ indicate the current-voltage characteristic of the memory element having the element structure 1 before writing data by an electric action to make the memory element portion short-circuit, and plots 281$b$ indicate the current-voltage characteristic of the memory element having the element structure 1 after writing data by an electric action to make the memory element portion short-circuit. Plots 282$a$ indicate the current-voltage characteristic of the memory element having the element structure 2 before writing data by an electric action to make the memory element portion short-circuit, and plots 282$b$ indicate the current-voltage characteristic of the memory element having the element structure 2 after writing data by an electric action to make the memory element portion short-circuit.

FIG. 14 shows a significant change in the current-voltage characteristics of memory elements having the element structures 1 and 2 before and after short-circuit of the memory element portions. For example, the current values of the memory element portions having the element structures 1 and 2 before short-circuit of the element portions are $1.6 \times 10^{-4}$ $mA/cm^2$ and $2.4 \times 10^{-4}$ $mA/cm^2$, respectively at an applied voltage 1 V, whereas the current values after short-circuit of the memory element portions are $2.5 \times 10^2$ $mA/cm^2$ and $4.3 \times 10^2$ $mA/cm^2$, respectively at an applied voltage 1 V; accordingly, the current values change for six-digit before and after short-circuit of the memory element portions. That is, the resistance values of the memory elements having the element structures 1 and 2 are lowered significantly after short-circuit of the memory element portions compared with those of before short-circuit of the memory element portions.

As described above, the resistance values of the organic memory element portions change before and after short-circuit of the memory element portions, and the memory element portions having the element structures 1 and 2 can serve as memory circuits when the changes of the resistance values of the memory element portions are read in voltage values or current values.

According to FIG. 14, the voltages at which short circuits of the memory element portions having the element structures 1 and 2 occur are 9.6 V and 18.2 V, respectively. The memory element portion having the element structure 1 can be short-circuited at the lower voltage compared with that of the memory element portion having the element structure 2. That is, a driving voltage required to make a short circuit of a memory element for writing data can be lowered by using an organic compound layer which is formed by stacking a mixed layer formed from an organic compound material and an inorganic compound material over a layer formed from an organic compound material. As a result, by stacking a mixed layer formed from an organic compound material and an inorganic compound material over a layer formed from an organic compound material, a thick film thickness and low power consumption can be achieved at the same time.

This example can be freely combined with the embodiment modes 1 to 3 and the examples 1 to 4.

EXAMPLE 6

The application range of the semiconductor device of the invention is wide. For example, a wireless tag as one mode of the semiconductor device 20 according to the present invention can be provided for a bill, a coin, securities, a certificate, a bearer bond, a packaging container, a book, a memory medium, personal belongings, a vehicle, groceries, a garment, a health product, a daily commodity, a medicine, an electronic appliance, and the like.

Figure 15A:
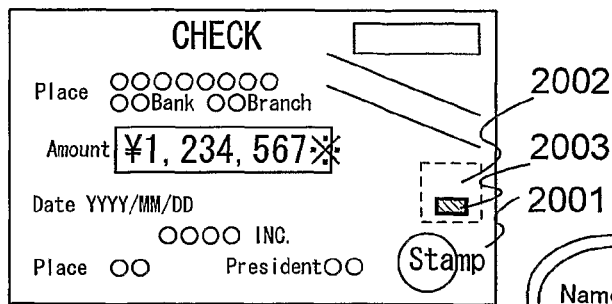
FIGS. 15A to 15F are views of examples of electronic appliances.

The bill and coin are money that circulates in the market, including the ones that can be used in the same way as money in a specific area (cash voucher), a commemorative coin, and the like. The securities include a check, a certificate, a promissory note, and the like (FIG. 15A). As shown in FIG. 15A, a check 2001 is provided with a wireless tag 2002 having an identification surface 2003. By applying an identification function for collating information by both of a wireless communication signal reading means and an optical system reading means and checking whether the information is accorded with each other or not, forgery can be prevented.

Figure 15B:
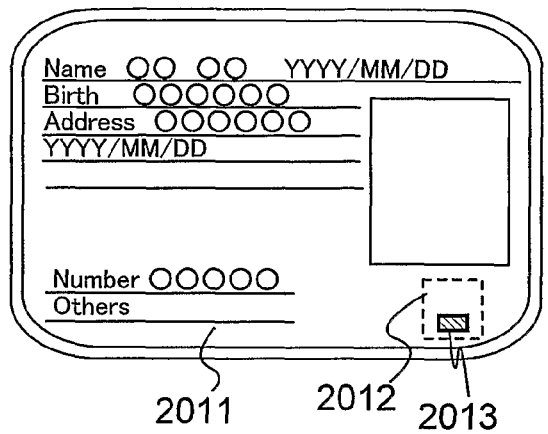

The certificate includes a driver's license, a resident's card, and the like (FIG. 15B). As shown in FIG. 15B, a driver's license 2011 is provided with a wireless tag 2012 having an identification surface 2013. By applying an identification function for collating information by both of a wireless communication signal reading means and an optical system reading means and checking whether the information is accorded with each other or not, forgery can be prevented.

Figure 15C:
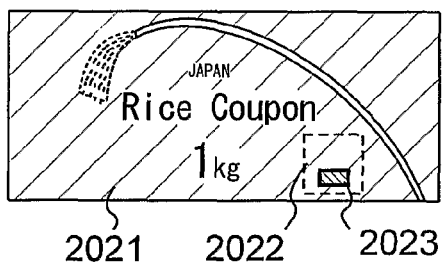

The bearer bond includes a stamp, a merchandise coupon, various gift certificates, and the like (FIG. 15C). As shown in FIG. 15C, a merchandise coupon 2021 is provided with a wireless tag 2022 having an identification surface 2023. By applying an identification function for collating information by both of a wireless communication signal reading means and an optical system reading means and checking whether the information is accorded with each other or not, forgery can be prevented.

Figure 15D:
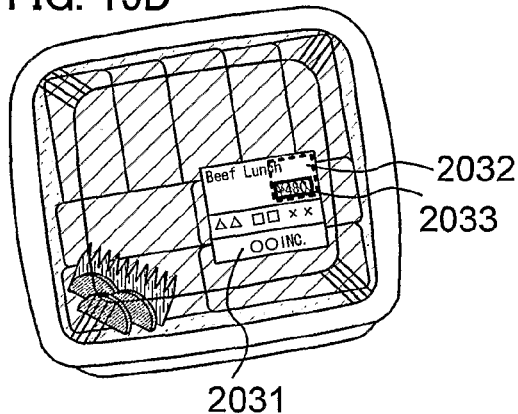

The packaging container includes a packaging paper of a packed lunch, a plastic bottle, cardboard boxes, and the like (FIG. 15D). As shown in FIG. 15D, a container 2031 of a packed lunch or the like is provided with a wireless tag 2032 having an identification surface 2033. By writing data to the identification surface 2033, the price can be checked visually. By applying an identification function for collating information by both of a wireless communication signal reading means and an optical system reading means and checking whether the information is accorded with each other or not, forgery can be prevented.

Figure 15E:
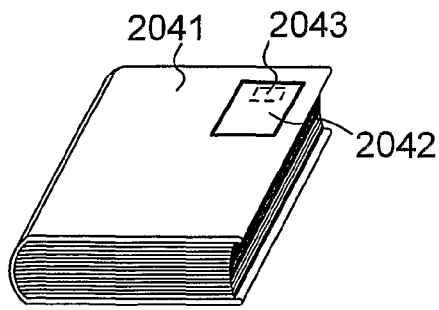

The book includes a book, and the like (FIG. 15E). As shown in FIG. 15E, a book 2041 is provided with a wireless tag 2042 having an identification surface 2043. By applying an identification function for collating information by both of a wireless communication signal reading means and an optical system reading means and checking whether the information is accorded with each other or not, an error in reading can be prevented.

Figure 15F:
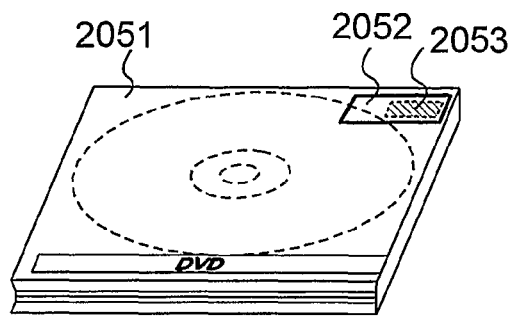

The memory medium includes a DVD software, a video tape, and the like (FIG. 15F). As shown in FIG. 15F, a DVD case 2051 is provided with a wireless tag 2052 having an identification surface 2053. By applying an identification function for collating information by both of a wireless communication signal reading means and an optical system reading means and checking whether the information is accorded with each other or not, an error in reading can be prevented.

The personal belongings correspond to a bag, glasses, and the like. The vehicle corresponds to a wheeled vehicle such as a bicycle, a ship, and the like. The groceries correspond to foods, beverages, and the like. The garment corresponds to clothes, shoes, and the like. The health product corresponds to a medical apparatus, a health appliance, and the like. The daily commodity corresponds to furniture, lightings, and the like. The medicine corresponds to a drug, an agricultural chemical, and the like. The electronic appliance corresponds to a liquid crystal display device, an EL display device, a television set (a television receiver, a thin television receiver), a portable phone, and the like.

By providing a semiconductor device according to the present invention for a packaging container, a memory medium, personal belongings, groceries, cloths, a daily commodity, an electronic appliance and the like, efficiency of an inspection system thereof and the like can be improved.

A semiconductor device according to the present invention has a memory element having a simple structure in which an organic compound layer is formed between a pair of conductive layers. Consequently, an electronic appliance using an inexpensive semiconductor device can be provided. In addition, high integration of the semiconductor device according to the present invention is easy, and so an electronic appliance using semiconductor device having a memory circuit with large capacity can be provided.

In addition, in a memory circuit included in a semiconductor device according to the present invention, data can be written by an optical action or an electrical action and can be read by both of wireless communication signal reading means and an optical system reading means. The memory circuit is nonvolatile and data can be additionally written. Consequently, forgery can be prevented because data cannot be rewritten though data can be additionally written. Therefore, an electronic appliance having a semiconductor device in which a high function and a high added value are realized can be provided.

This example can be freely combined with the embodiment modes 1 to 3 and the examples 1 to 5.

INDUSTRIAL APPLICABILITY

Wireless tag systems for identification with fairly ensured security and high efficiency can be obtained by applying the present invention to management of a distribution system, articles such as merchandise and people.

The invention claimed is:

1. A semiconductor device comprising:
   a memory having a memory cell array having a plurality of memory cells;
   a circuit for controlling the memory;
   an antenna;
   a bit line extending in a first direction;
   a word line extending in a second direction which is perpendicular to the first direction; and
   a material layer provided between the bit line and the word line,
   wherein at least one of the bit line and the word line have a light transmitting property,
   wherein an optical property and an electrical resistance of the material layer are changeable irreversibly with writing a data by light irradiation or voltage application, and
   wherein the memory has an identification surface with which recorded information is read by an optical reading means.

2. A semiconductor device according to claim 1, further comprising a collating means for collating a first data obtained by reading a recorded data in the memory using a wireless signal and a second data obtained by reading a data from the identification surface of the memory using the optical reading means.

3. A semiconductor device comprising:
   a memory having a memory cell array having a plurality of memory cells;
   a circuit for controlling the memory;
   an antenna;
   a bit line extending in a first direction;
   a word line extending in a second direction which is perpendicular to the first direction; and
   a material layer provided between the bit line and the word line,
   wherein at least one of the bit line and the word line have a light transmitting property,
   wherein an optical property and an electrical resistance of the material layer are changeable irreversibly with writing data by light irradiation or voltage application, and
   wherein the memory has one recorded data read by a plurality of different reading means.

4. A semiconductor device according to claim 1 or 3, wherein a phase of the material layer changes from a first state to a second state by light irradiation and thereby electrical resistance between the bit line and the word line changes.

5. A semiconductor device according to claim 1, wherein a phase of the material layer changes from the first state to the second state by light irradiation, and the phase change can be read at the identification surface.

6. A semiconductor device according to claim 1 or 3, wherein the circuit for controlling the memory comprises a thin film transistor.

7. A semiconductor device according to claim 1 or 3, further comprising a circuit comprising a thin film transistor, and electrically connected to the antenna.

8. A semiconductor device according to claim 1 or 3, wherein the circuit for controlling the memory and a circuit electrically connected to the antenna are formed over a common base material.

9. A semiconductor device according to claim 1 or 3, wherein the semiconductor device is sealed by a base material and a sealing material, and at least one of the base material and the sealing material have a light transmitting property.

10. A semiconductor device according to claim 1 or 3, wherein the semiconductor device is interposed between a base material and a sealing material, and the base material and the sealing material comprises resin.

11. A semiconductor device according to claim 1 or 3, wherein the material layer comprises optical property is a reflectance property.

12. A semiconductor device according to claim 1 or 3, wherein the material layer comprises an organic material which has a highly hole transporting property or a highly electron transporting property.

13. A semiconductor device according to claim 1 or 3, wherein the material layer comprises an inorganic material which is a material selected from the group consisting of tellurium, tellurium oxide, antimony, selenium, and bismuth.

* * * * *